(12) United States Patent
Hu

(10) Patent No.: US 9,791,968 B2
(45) Date of Patent: Oct. 17, 2017

(54) SHIFT REGISTER, ITS DRIVING METHOD, GATE DRIVER CIRCUIT AND DISPLAY DEVICE

(71) Applicants: BOE TECHNOLOGY GROUP CO., LTD., Beijing (CN); CHENGDU BOE OPTOELECTRONICS TECHNOLOGY CO., LTD., Chengdu (CN)

(72) Inventor: Like Hu, Beijing (CN)

(73) Assignees: BOE TECHNOLOGY GROUP CO., LTD. (CN); CHENGDU BOE OPTOELECTRONICS TECHNOLOGY CO., LTD. (CN)

( * ) Notice: Subject to any disclaimer, the term of this patent is extended or adjusted under 35 U.S.C. 154(b) by 0 days.

(21) Appl. No.: 15/306,264

(22) PCT Filed: Jan. 27, 2016

(86) PCT No.: PCT/CN2016/072265
§ 371 (c)(1),
(2) Date: Oct. 24, 2016

(87) PCT Pub. No.: WO2017/036083
PCT Pub. Date: Mar. 9, 2017

(65) Prior Publication Data
US 2017/0269769 A1 Sep. 21, 2017

(30) Foreign Application Priority Data
Sep. 6, 2015 (CN) .......................... 2015 1 0560839

(51) Int. Cl.
*G11C 19/00* (2006.01)
*G06F 3/041* (2006.01)
(Continued)

(52) U.S. Cl.
CPC .......... *G06F 3/0416* (2013.01); *G09G 5/003* (2013.01); *G11C 19/28* (2013.01);
(Continued)

(58) Field of Classification Search
None
See application file for complete search history.

(56) References Cited

U.S. PATENT DOCUMENTS

| 2010/0002827 A1 | 1/2010 | Shih et al. |
| 2011/0001689 A1 | 1/2011 | Maru et al. |
| | (Continued) | |

FOREIGN PATENT DOCUMENTS

| CN | 104021769 A | 9/2014 |
| CN | 104505014 A | 4/2015 |
| | (Continued) | |

OTHER PUBLICATIONS

International Search Report and Written Opinion for Application No. PCT/CN2016/072265, dated Jan. 27, 2016, 13 Pages.

*Primary Examiner* — Tuan T Lam
(74) *Attorney, Agent, or Firm* — Brooks Kushman P.C.

(57) ABSTRACT

The present disclosure provides a shift register, its driving method, a gate driver circuit and a display device. The shift register includes an input module, a resetting module, a touch switching module, a node control module, a first output module and a second output module. In the shift register, through the cooperation of the above six modules, it is able to provide a touch stage between any two adjacent time periods of a display stage, it enables a driving signal output end of the shift register to output a DC signal at the touch stage, and enable the gate driver circuit to achieve a display function after the touch stage is ended.

20 Claims, 18 Drawing Sheets

(51) Int. Cl.
*G09G 5/00* (2006.01)
*G11C 19/28* (2006.01)

(52) U.S. Cl.
CPC ............... *G09G 2300/0426* (2013.01); *G09G 2310/0267* (2013.01); *G09G 2310/0283* (2013.01); *G09G 2310/0286* (2013.01); *G09G 2310/08* (2013.01)

(56) References Cited

U.S. PATENT DOCUMENTS

| | | | |
|---|---|---|---|
| 2013/0241814 A1* | 9/2013 | Hirabayashi | G09G 3/3677 345/100 |
| 2015/0266699 A1* | 9/2015 | Morgan | B65H 75/4407 242/397.3 |
| 2016/0046126 A1* | 2/2016 | Okuyama | B41J 2/14201 347/70 |
| 2016/0246418 A1* | 8/2016 | Wang | G11C 19/28 |
| 2016/0365061 A1* | 12/2016 | Hong | G06F 3/041 |
| 2016/0370928 A1* | 12/2016 | Hao | G06F 3/044 |
| 2016/0372070 A1* | 12/2016 | Hu | G09G 3/3614 |
| 2017/0010731 A1* | 1/2017 | Zhang | G11C 19/28 |
| 2017/0102814 A1* | 4/2017 | Xu | G06F 3/0412 |
| 2017/0108989 A1* | 4/2017 | Gu | G06F 3/0418 |
| 2017/0123556 A1* | 5/2017 | Lin | G06F 3/0412 |
| 2017/0132967 A1* | 5/2017 | Liu | G09G 3/2092 |
| 2017/0178749 A1* | 6/2017 | Ma | G11C 19/287 |

FOREIGN PATENT DOCUMENTS

| | | |
|---|---|---|
| CN | 104834427 A | 8/2015 |
| CN | 104866141 A | 8/2015 |
| CN | 105185290 A | 12/2015 |

* cited by examiner

SHIFT REGISTER, ITS DRIVING METHOD, GATE DRIVER CIRCUIT AND DISPLAY DEVICE

CROSS-REFERENCE TO RELATED APPLICATIONS

This application is the U.S. national phase of PCT Application No. PCT/CN2016/072265 filed on Jan. 27, 2016, which claims priority to Chinese Patent Application No. 201510560839.5 filed on Sep. 6, 2015, the disclosures of which are incorporated in their entirety by reference herein.

TECHNICAL FIELD

The present disclosure relates to the field of display technology, in particular to a shift register, its driving method, a gate driver circuit and a display device.

BACKGROUND

For a thin film transistor (TFT) display panel, usually a gate driving signal is applied by a gate driver circuit to a gate electrode of each TFT at a pixel region. The gate driver circuit may be formed on an array substrate of the display panel through an array process, i.e., a Gate Driver on Array (GOA) process. Through this integration process, it is able to reduce the production cost and save a wiring space for a bonding region and a fan-out region for a gate integrated circuit (IC), thereby to enable to provide the display panel with a narrow bezel.

Currently, a conventional gate driver circuit consists of a plurality of shift registers connected to each other in a cascaded manner, and a gate scanning signal is applied by the shift registers to gate lines on the display panel sequentially. For a display device where a touch function and a display function are driven in a time-division manner, in order to provide a plurality of touch periods within a period for displaying one image frame, usually it is required to connect a plurality of gate driver circuits in a cascaded manner. Each gate driver circuit is merely connected to several corresponding gate lines, and the touch periods are provided within the period for displaying one image frame through controlling a sequence of start triggering signals applied to gate driver circuits. However, the more the touch periods to be provided within the period for displaying one image frame, the more the control signals and the control lines. At this time, the circuit is too complex to provide the narrow bezel. In addition, the touch periods can merely be provided within a fixed time period, and thus cannot be flexibly adjusted.

SUMMARY

An object of the present disclosure is to provide a shift register, its driving method, a gate driver circuit and a display device, so as to provide a simple structure for a narrow bezel, and provide a touch period within any display period.

In one aspect, the present disclosure provides in some embodiments a shift register, including an input module, a resetting module, a touch switching module, a node control module, a first output module and a second output module. A first end of the input module is configured to receive an input signal, a second end thereof is configured to receive a first clock signal, and a third end thereof is connected to a first node. The input module is configured to enable the first node to be at a first potential in the case that the input signal and the first clock signal are both at the first potential. A first end of the resetting module is configured to receive a resetting signal, a second end thereof is configured to receive a third clock signal, and a third end thereof is connected to the first node. The resetting module is configured to enable the first node to be at the first potential in the case that the resetting signal and the third clock signal are both at the first potential. A first end of the touch switching module is configured to receive a first touch-control signal, a second end thereof is connected to the first node, and a third end thereof is connected to a second node. The touch switching module is configured to, under the control of the first touch-control signal, enable the first node to be electrically connected to the second node at a display stage, and enable the first node to be electrically disconnected from the second node at a touch stage. A first end of the node control module is configured to receive a direct current (DC) signal, a second end thereof is configured to receive a fourth clock signal, a third end thereof is configured to receive a second touch-control signal, a fourth end thereof is connected to the first node, a fifth end thereof is connected to the second node, and a sixth end thereof is connected to a third node. The node control module is configured to apply the DC signal to the first node in the case that the third node is at the first potential, apply the fourth clock signal to the third node in the case that the fourth clock signal is at the first potential, apply the second touch-control signal to the third node in the case that the second node is at the first potential, and maintain a voltage difference between the first end of the node control module and the third node to be a voltage difference within a previous time period in the case that the third node is in a floating state. A first end of the first output module is connected to the second node, a second end thereof is configured to receive a second clock signal, and a third end thereof is connected to a driving signal output end of the shift register. The first output module is configured to apply the second clock signal to the driving signal output end in the case that the second node is at the first potential, and maintain a voltage difference between the second node and the driving signal output end to be the voltage difference within the previous time period in the case that the second node is in a floating state. A first end of the second output module is connected to the third node, a second end thereof is configured to receive the DC signal, and a third end thereof is connected to the driving signal output end. The second output module is configured to apply the DC signal to the driving signal output end in the case that the third node is at the first potential. In the case that a valid pulse signal of the input signal is at a high potential, the first potential is a high potential, the DC signal is at a low potential, and the second touch-control signal is at a low potential at the display stage and a high potential at the touch stage. In the case that the valid pulse signal of the input signal is at a low potential, the first potential is a low potential, the DC signal is at a high potential, and the second touch-control signal is at a high potential at the display stage and a low potential at the touch stage.

Optionally, the shift register further includes a third output module, a first end of which is configured to receive a third touch-control signal, a second end of which is configured to receive the DC signal, and a third end of which is connected to the driving signal output end. The third output module is configured to apply the DC signal to the driving signal output end at the touch stage under the control of the third touch-control signal.

Optionally, the input module includes a first switch transistor, a drain electrode of which is connected to the first node. A gate electrode of the first switch transistor is configured to receive the input signal and a source electrode thereof is configured to receive the first clock signal, or the gate electrode of the first switch transistor is configured to receive the first clock signal and the source electrode thereof is configured to receive the input signal.

Optionally, the resetting module includes a second switch transistor, a drain electrode of which is connected to the first node. A gate electrode of the second switch transistor is configured to receive the resetting signal and a source electrode thereof is configured to receive the third clock signal, or the gate electrode of the second switch transistor is configured to receive the third clock signal and the source electrode thereof is configured to receive the resetting signal.

Optionally, the touch switching module includes a third switch transistor, a gate electrode of which is configured to receive the first touch-control signal, a source electrode of which is connected to the first node, and a drain electrode of which is connected to the second node.

Optionally, the node control module includes a fourth switch transistor, a fifth switch transistor, a sixth switch transistor and a first capacitor. A gate electrode of the fourth switch transistor is connected to the third node, a source electrode thereof is configured to receive the DC signal, and a drain electrode thereof is connected to the first node. A gate electrode and a source electrode of the fifth switch transistor are configured to receive the fourth clock signal, and a drain electrode thereof is connected to the third node. A gate electrode of the sixth switch transistor is connected to the second node, a source electrode thereof is configured to receive the second touch-control signal, and a drain electrode thereof is connected to the third node. One end of the first capacitor is connected to the third node, and the other end thereof is configured to receive the DC signal.

Optionally, the first output module includes a seventh switch transistor and a second capacitor. A gate electrode of the seventh switch transistor is connected to the second node, a source electrode thereof is configured to receive the second clock signal, and a drain electrode thereof is connected to the driving signal output end. One end of the second capacitor is connected to the second node, and the other end thereof is connected to the driving signal output end.

Optionally, the second output module includes an eighth switch transistor, a gate electrode of which is connected to the third node, a source electrode of which is configured to receive the DC signal, and a drain electrode of which is connected to the driving signal output end.

Optionally, the third output module includes a ninth switch transistor, a gate electrode of which is configured to receive the third touch-control signal, a source electrode of which is configured to receive the DC signal, and a drain electrode of which is connected to the driving signal output end.

Optionally, in the case that the valid pulse signal of the input signal is a high potential, all of the switch transistors are N-type transistors, and in the case that the valid pulse signal of the input signal is a low potential, all of the switch transistors are P-type transistors.

In another aspect, the present disclosure provides in some embodiments a gate driver circuit including a plurality of the above-mentioned shift registers connected to each other in a cascaded manner. An input signal is applied to a first-level shift register through a start signal end. Apart from the first-level shift register, an input signal is applied to a current-level shift register through a driving signal output end of a previous-level shift register. Apart from a last-level shift register, a resetting signal is applied to the current-level shift register through a driving signal output end of a next-level shift register.

In yet another aspect, the present disclosure provides in some embodiments a display device including the above-mentioned gate driver circuit.

In still yet another aspect, the present disclosure provides in some embodiments a method for driving the above-mentioned shift register, including a display stage and a touch stage. The display stage includes a first stage, a second stage, a third stage and a fourth stage.

At the first stage, the input module is configured to apply the first clock signal to the first node under the control of the input signal, the touch switching module is configured to, under the control of the first touch-control signal, enable the first node to be electrically connected to the second node and apply a potential at the first node to the second node, the node control module is configured to, under the control of the potential at the second node, apply the second touch-control signal to the third node, and the first output module is configured to, under the control of the potential at the second node, apply the second clock signal to the driving signal output end.

At the second stage, the second node is in a floating state, the first output module is configured to maintain a voltage difference between the second node and the driving signal output end to be a voltage difference within a previous time period, and under the control of the potential at the second node, apply the second clock signal to the driving signal output end, and the node control module is configured to, under the control of the potential at the second node, apply the second touch-control signal to the third node.

At the third stage, the resetting module is configured to, under the control of the resetting signal, apply the third clock signal to the first node, the touch switching module is configured to, under the control of the first touch-control signal, enable the first node to be electrically connected to the second node and apply the potential at the first node to the second node, the node control module is configured to, under the control of the potential at the second node, apply the second touch-control signal to the third node, and the first output module is configured to, under the control of the potential at the second node, apply the second clock signal to the driving signal output end.

At the fourth stage, the node control module is configured to, under the control of the fourth clock signal, apply the fourth clock signal to the third node and, under the control of the potential at the third node, apply the DC signal to the first node, the touch switching module is configured to, under the control of the first touch-control signal, enable the first node to be electrically connected to the second node and apply the potential at the first node to the second node, and the second output module is configured to, under the control of the potential at the third node, apply the DC signal to the driving signal output end.

At the touch stage, the touch switching module is configured to, under the control of the first control signal, enable the first node to be electrically disconnected from the second node, and the second node is in a floating stage such that the first output module is configured to maintain a voltage difference between the second node and the driving signal output end to be the voltage difference within the previous time period and the node control module is configured to, under the control of the potential at the second node, apply the second touch-control signal to the third node, or the third node is in a floating state such that the node control module is configured to maintain a voltage difference between the first end of the node control module and the third node to be the voltage difference within the previous time period, and the second output module is configured to, under the control of the potential at the third node, apply the DC signal to the driving signal output end.

Optionally, the touch stage is capable of being provided between any two adjacent ones of the first stage, the second stage, the third stage and the fourth stage of the display stage, or after the fourth stage of the display stage.

Optionally, in the case that the touch stage is provided between the first stage and the second stage, or between the second stage and the third stage, or between the third stage and the fourth stage, the touch switching module is configured to, under the control of the first touch-control signal, enable the first node to be electrically disconnected from the second node, the second node is in the floating state such that the first output module is configured to maintain the voltage difference between the second node and the driving signal output end to be the voltage difference within the previous time period and the node control module is configured to, under the control of the potential at the second node, apply the second touch-control signal to the third node, and the second output module is configured to, under the control of the potential at the third node, apply the DC signal to the driving signal output end. In the case that the touch stage is provided after the fourth stage, the touch switching module is configured to, under the control of the first touch-control signal, enable the first node to be electrically disconnected from the second node, the third node is in the floating state such that the node control module is configured to maintain the voltage difference between the first end of the node control module and the third node to be the voltage difference within the previous time period, and the second output module is configured to, under the control of the potential at the third node, apply the DC signal to the driving signal output end.

According to the shift register, its driving method, the gate driver circuit and the display device in the embodiments of the present disclosure, the shift register includes the input module, the resetting module, the touch switching module, the node control module, the first output module and the second output module. The input module is configured to adjust the potential at the first node through the input signal and the first clock signal, and the resetting module is configured to adjust the potential at the first node through the resetting signal and the third clock signal. The touch switching module is configured to, under the control of the first touch-control signal, enable the first node to be electrically connected to the second node at the display stage, and enable the first node to be electrically disconnected from the second node at the touch stage. The node control module is configured to adjust the potential at the first node and the potential at the third node through the DC signal, the fourth clock signal, the second touch-control signal, the potential at the second node and the potential at the third node. The first output module is configured to adjust the potential at the driving signal output end through the second clock signal and the potential at the second node. The second output module is configured to adjust the potential at the driving signal output end through the DC signal and the potential at the third node. In the shift register, through the cooperation of the above six modules, it is able to provide the touch stage between any two adjacent time periods of the display stage, so as to enable the driving signal output end of the shift register to output the DC signal at the touch stage, and enable to continue to achieve a display function after the touch stage is ended. As a result, it is able to provide the shift register with a simple structure for the narrow bezel, and to provide the touch period within any display period.

BRIEF DESCRIPTION OF THE DRAWINGS

In order to illustrate the technical solutions in the embodiments of the present disclosure or the related art in a clearer manner, the drawings desired for the present disclosure or the related art will be described briefly hereinafter. Obviously, the following drawings merely relate to parts of the embodiments of the present disclosure, and a person skilled in the art may, without any creative effort, acquire the other drawings based on these drawings.

FIG. 2a is a specific schematic view showing the shift register in FIG. 1a;

FIG. 2b is another specific schematic view showing the shift register in FIG. 1a;

FIGS. 5a-5e are timing sequence diagrams of the shift register in FIG. 2a;

DETAILED DESCRIPTION

In order to make the objects, the technical solutions and the advantages of the present disclosure more apparent, the present disclosure will be described hereinafter in a clear and complete manner in conjunction with the drawings and embodiments. Obviously, the following embodiments merely relate to a part of, rather than all of, the embodiments of the present disclosure, and based on these embodiments, a person skilled in the art may, without any creative effort, obtain the other embodiments, which also fall within the scope of the present disclosure.

Unless otherwise defined, any technical or scientific term used herein shall have the common meaning understood by a person of ordinary skills. Such words as "first" and "second" used in the specification and claims are merely used to differentiate different components rather than to represent any order, number or importance. Similarly, such words as "one" or "a" are merely used to represent the existence of at least one member, rather than to limit the number thereof. Such words as "connect" or "connected to" may include electrical connection, direct or indirect, rather than to be limited to physical or mechanical connection. Such words as "on", "under", "left" and "right" are merely used to represent relative position relationship, and when an absolute position of the object is changed, the relative position relationship will be changed too.

The shift register, its driving method, the gate driver circuit and the display device in the embodiments of the present disclosure will be described herein after in conjunction with the drawings.

Figure 1A:
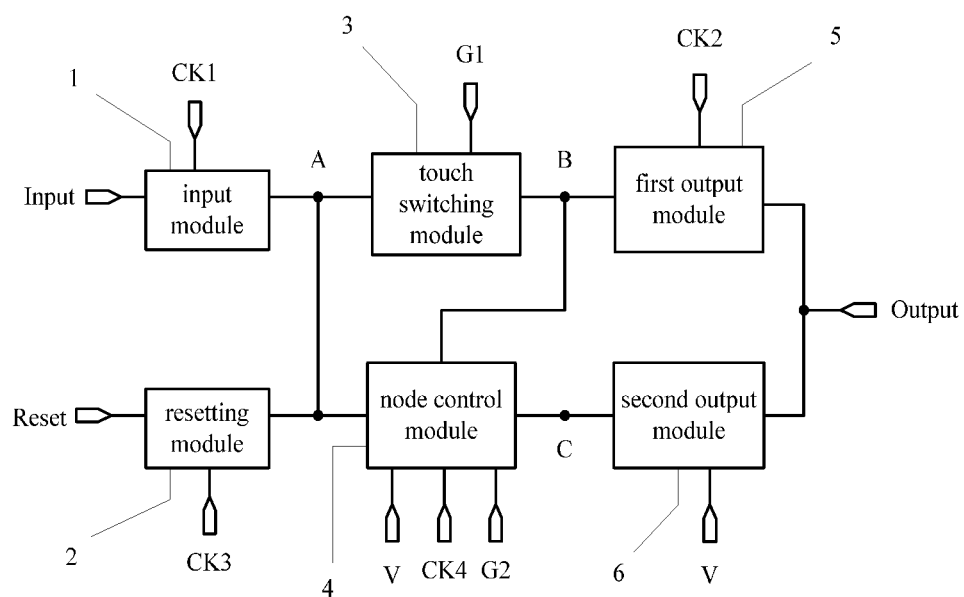
FIG. 1a is a schematic view showing a shift register according to some embodiments of the present disclosure.

As shown in FIG. 1a, the present disclosure provides in some embodiments a shift register, which includes an input module 1, a resetting module 2, a touch switching module 3, a node control module 4, a first output module 5 and a second output module 6. A first end of the input module 1 is configured to receive an input signal Input, a second end thereof is configured to receive a first clock signal CK1, and a third end thereof is connected to a first node A. The input module 1 is configured to enable the first node A to be at a first potential in the case that the input signal Input and the first clock signal CK1 are both at the first potential.

A first end of the resetting module 2 is configured to receive a resetting signal Reset, a second end thereof is configured to receive a third clock signal CK3, and a third end thereof is connected to the first node A. The resetting module 2 is configured to enable the first node A to be at the first potential in the case that the resetting signal Reset and the third clock signal CK3 are both at the first potential.

A first end of the touch switching module 3 is configured to receive a first touch-control signal G1, a second end thereof is connected to the first node A, and a third end thereof is connected to a second node B. The touch switching module 3 is configured to, under the control of the first touch-control signal G1, enable the first node A to be electrically connected to the second node B at a display stage, and enable the first node A to be electrically disconnected from the second node B at a touch stage.

A first end of the node control module 4 is configured to receive a DC signal V, a second end thereof is configured to receive a fourth clock signal CK4, a third end thereof is configured to receive a second touch-control signal G2, a fourth end thereof is connected to the first node A, a fifth end thereof is connected to the second node B, and a sixth end thereof is connected to a third node C. The node control module 4 is configured to apply the DC signal V to the first node A in the case that the third node C is at the first potential, apply the fourth clock signal CK4 to the third node C in the case that the fourth clock signal CK4 is at the first potential, apply the second touch-control signal G2 to the third node C in the case that the second node B is at the first potential, and maintain a voltage difference between the first end of the node control module 4 and the third node C to be a voltage difference within a previous time period in the case that the third node C is in a floating state.

A first end of the first output module 5 is connected to the second node B, a second end thereof is configured to receive a second clock signal CK2, and a third end thereof is connected to a driving signal output end Output of the shift register. The first output module 5 is configured to apply the second clock signal CK2 to the driving signal output end Output in the case that the second node B is at the first potential, and maintain a voltage difference between the second node B and the driving signal output end Output to be the voltage difference within the previous time period in the case that the second node B is in a floating state.

A first end of the second output module 6 is connected to the third node C, a second end thereof is configured to receive the DC signal V, and a third end thereof is connected to the driving signal output end Output. The second output module 6 is configured to apply the DC signal V to the driving signal output end Output in the case that the third node C is at the first potential.

In the case that a valid pulse signal of the input signal Input is at a high potential, the first potential is a high potential, the DC signal is at a low potential, and the second touch-control signal G2 is at a low potential at the display stage and a high potential at the touch stage. In the case that the valid pulse signal of the input signal Input is at a low potential, the first potential is a low potential, the DC signal V is at a high potential, and the second touch-control signal G2 is at a high potential at the display stage and a low potential at the touch stage.

According to the shift register in the embodiments of the present disclosure, the shift register includes the input module, the resetting module, the touch switching module, the node control module, the first output module and the second output module. The input module is configured to adjust the potential at the first node through the input signal and the first clock signal, and the resetting module is configured to adjust the potential at the first node through the resetting signal and the third clock signal. The touch switching module is configured to, under the control of the first touch-control signal, enable the first node to be electrically connected to the second node at the display stage, and enable the first node to be electrically disconnected from the second node at the touch stage. The node control module is configured to adjust the potentials at the first node and the third node through the DC signal, the fourth clock signal, the second touch-control signal, the potential at the second node and the potential at the third node. The first output module is configured to adjust the potential at the driving signal output end through the second clock signal and the potential at the second node. The second output module is configured to adjust the potential at the driving signal output end through the DC signal and the potential at the third node. In the shift register, through the cooperation of the above six modules, it is able to provide the touch stage between any two adjacent time periods of the display stage, so as to enable the driving signal output end of the shift register to output the DC signal at the touch stage, and enable the gate driver circuit to continue to achieve a display function after the touch stage is ended. As a result, it is able to provide the shift register with a simple structure for the narrow bezel, and to provide the touch period within any display period.

It should be appreciated that, in the shift register, at the display stage, the first, second, third and fourth clock signals may have an identical period and an identical duty ratio.

In the case that the valid pulse signal of the input signal is at a high potential, a rising edge of the input signal is flush with a rising edge of the first clock signal, a rising edge of the resetting signal is flush with a rising edge of the third clock signal, a falling edge of the first clock signal is flush with a rising edge of the second clock signal and a falling edge of the input signal, a falling edge of the second clock signal is flush with the rising edge of the third clock signal, a falling edge of the third clock signal is flush with a rising edge of the fourth clock signal and a falling edge of the resetting signal, a falling edge of the fourth clock signal is flush with the rising edge of the first clock signal, and all of the signals have a duty ratio of 0.25. In the case that the valid pulse signal of the input signal is at a low potential, the falling edge of the input signal is flush with the falling edge of the first clock signal, the falling edge of the resetting signal is flush with the falling edge of the third clock signal, the rising edge of the first clock signal is flush with the falling edge of the second clock signal and the rising edge of the input signal, the rising edge of the second clock signal is flush with the falling edge of the third clock signal, the rising edge of the third clock signal is flush with the falling edge of the fourth clock signal and the rising edge of the resetting signal, the rising edge of the fourth clock signal is flush with the falling edge of the first clock signal, and all of the signals have a duty ratio of 0.75.

Figure 1B:
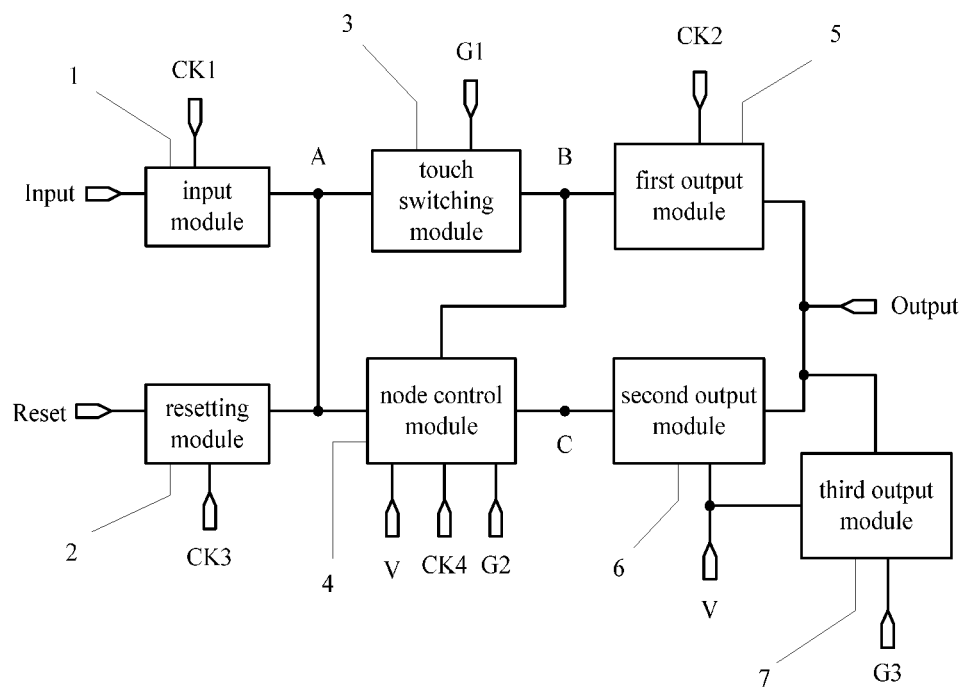
FIG. 1b is a schematic view showing another shift register according to some embodiments of the present disclosure.

In order to ensure the potential at the driving signal output end Output at the touch stage of the shift register, as shown in FIG. 1b, the shift register may further include a third output module 7, a first end of which is configured to receive a third touch-control signal CK3, a second end of which is configured to receive the DC signal V, and a third end of which is connected to the driving signal output end Output. The third output module 7 is configured to apply the DC signal V to the driving signal output end Output at the touch stage under the control of the third touch-control signal CK3.

The present disclosure will be described hereinafter in more details in conjunction with the embodiments. It should be appreciated that, the following embodiments are merely for illustrative purposes, but shall not be used to limit the scope of the present disclosure.

Optionally, in the shift register, as shown in FIGS. 2a-4b, the input module 1 may include a first switch transistor T1, a drain electrode of which is connected to the first node A.

Figure 2A:
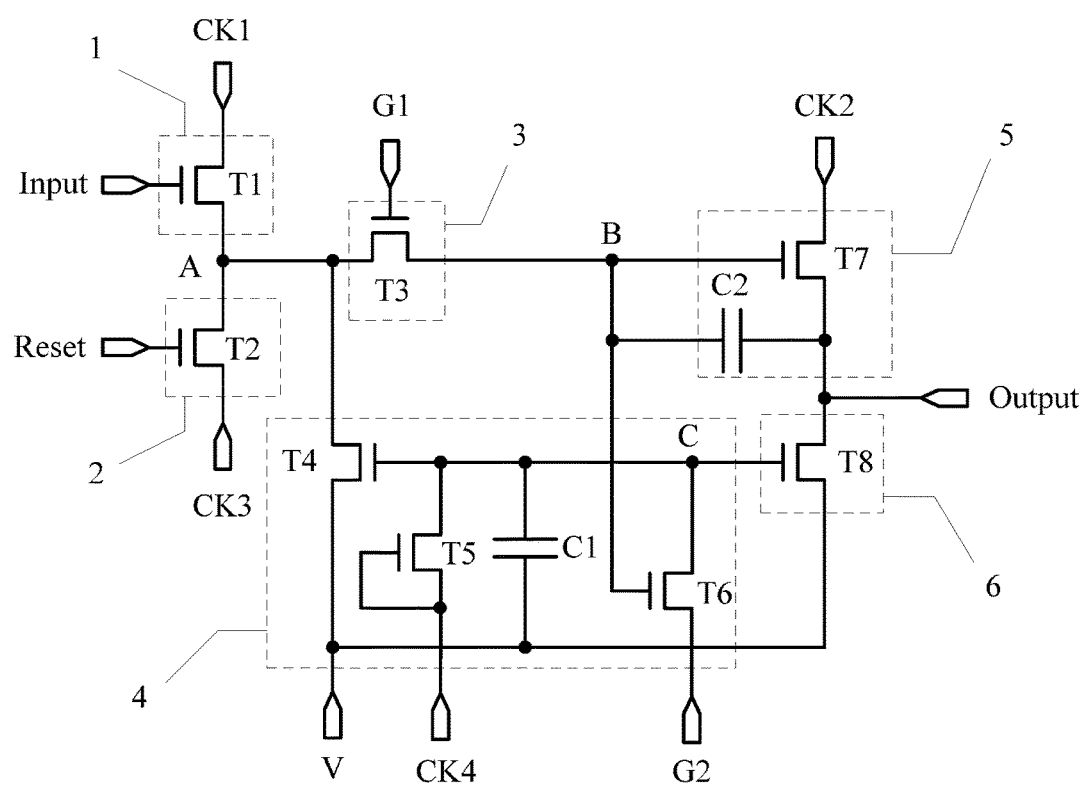
Figure 2B:
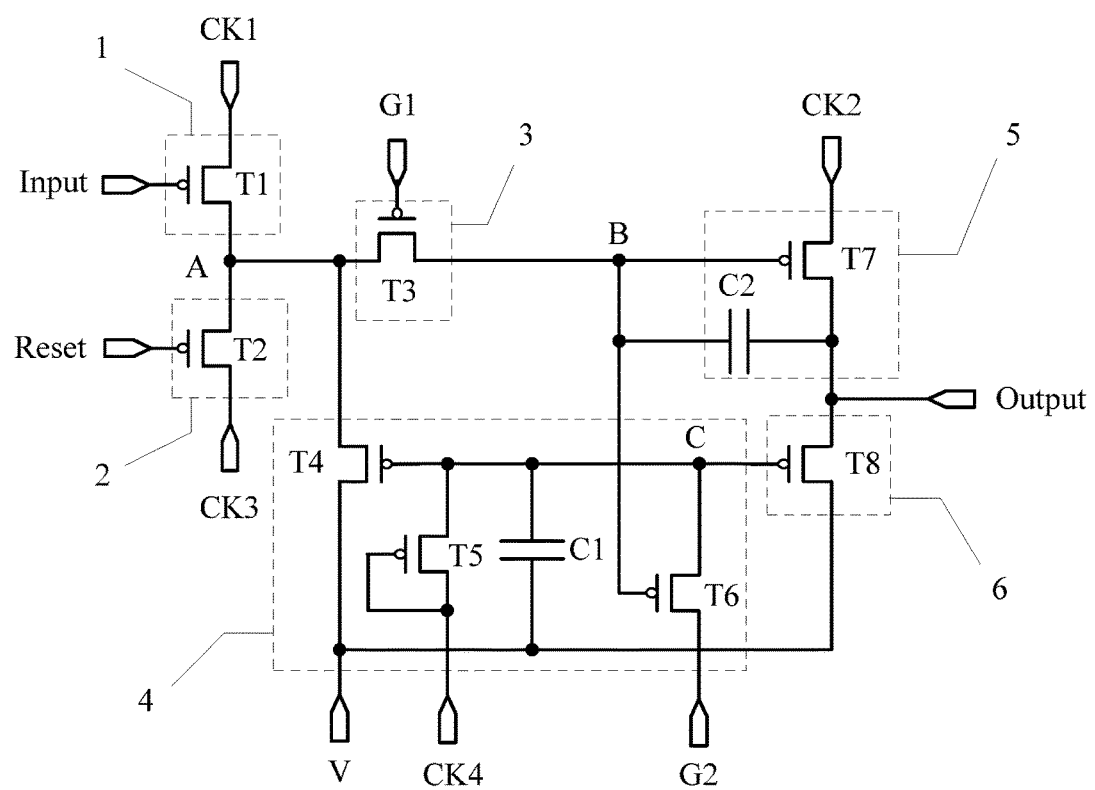
Figure 3A:
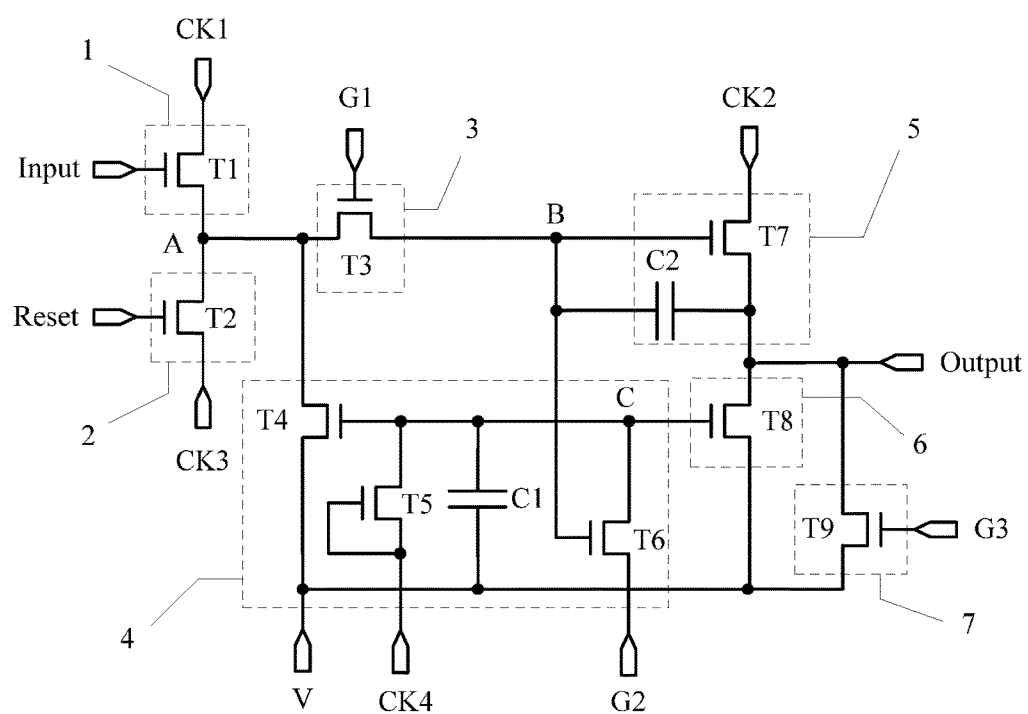
FIG. 3a is a specific schematic view showing the shift register in FIG. 1b.
Figure 3B:
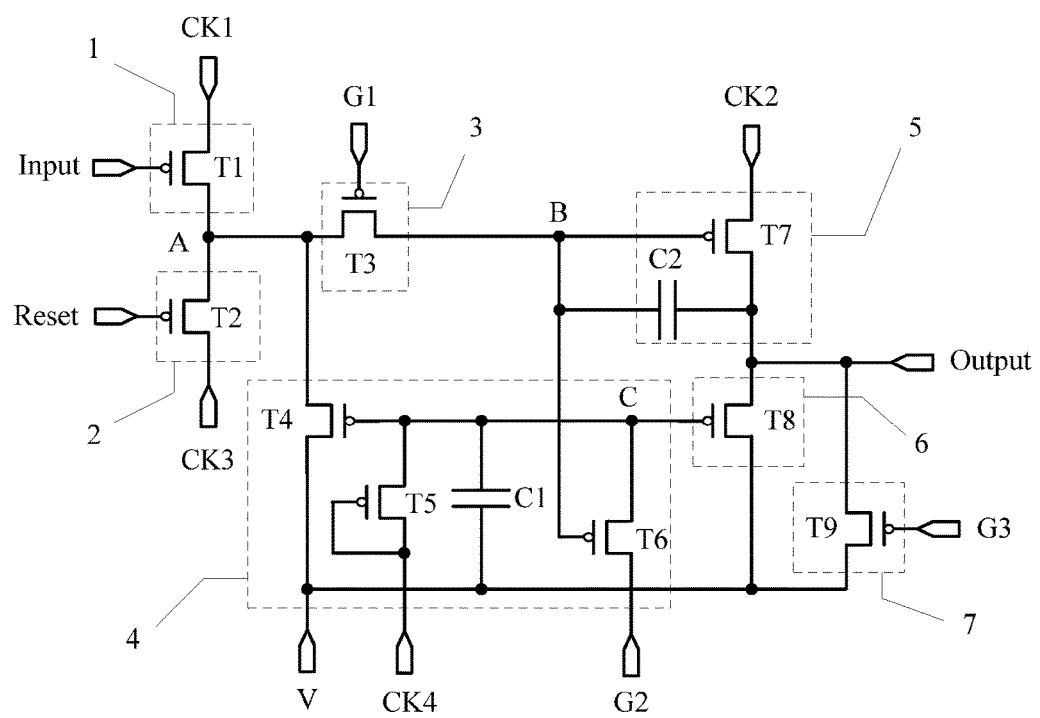
FIG. 3b is another specific schematic view showing the shift register in FIG. 1b.
Figure 3C:
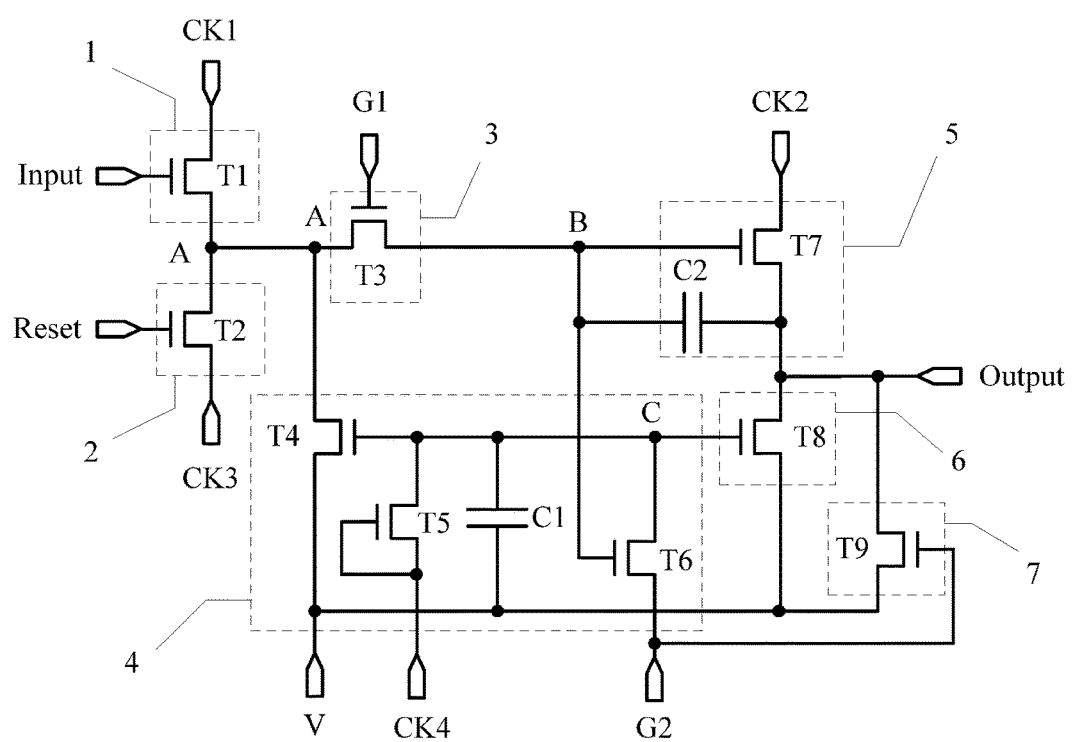
FIG. 3c is yet another specific schematic view showing the shift register in FIG. 1b.
Figure 3D:
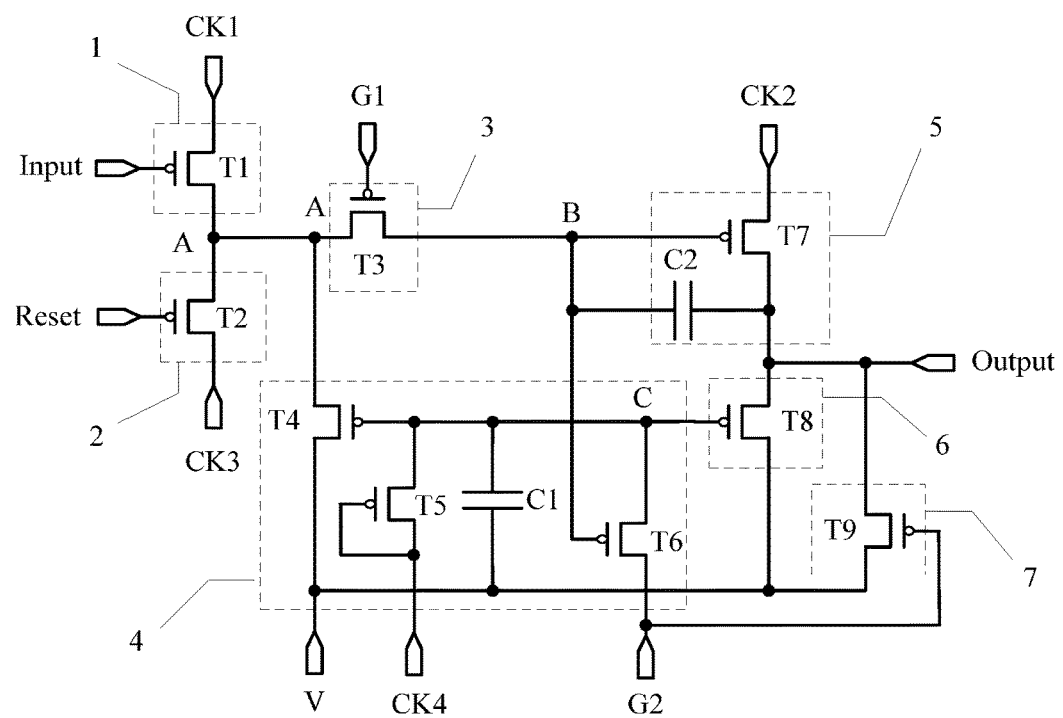
FIG. 3d is still yet another specific schematic view showing the shift register in FIG. 1b.
Figure 4A:
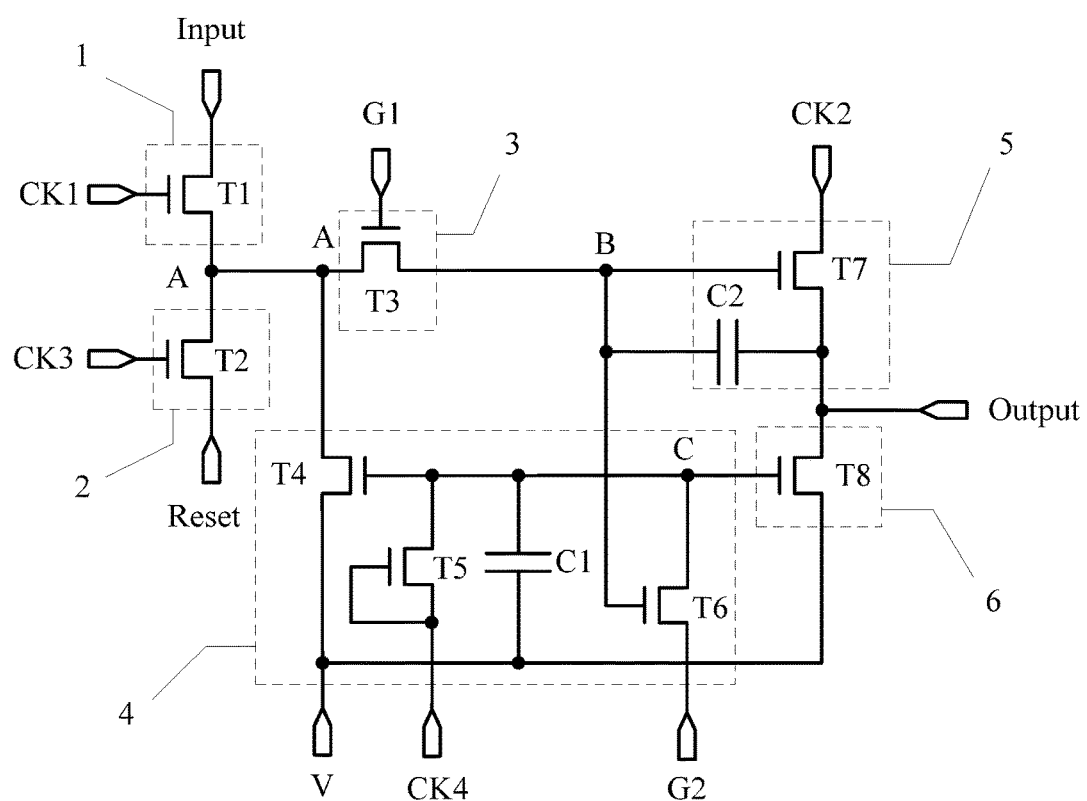
FIG. 4a is still yet another specific schematic view showing the shift register in FIG. 1b.
Figure 4B:
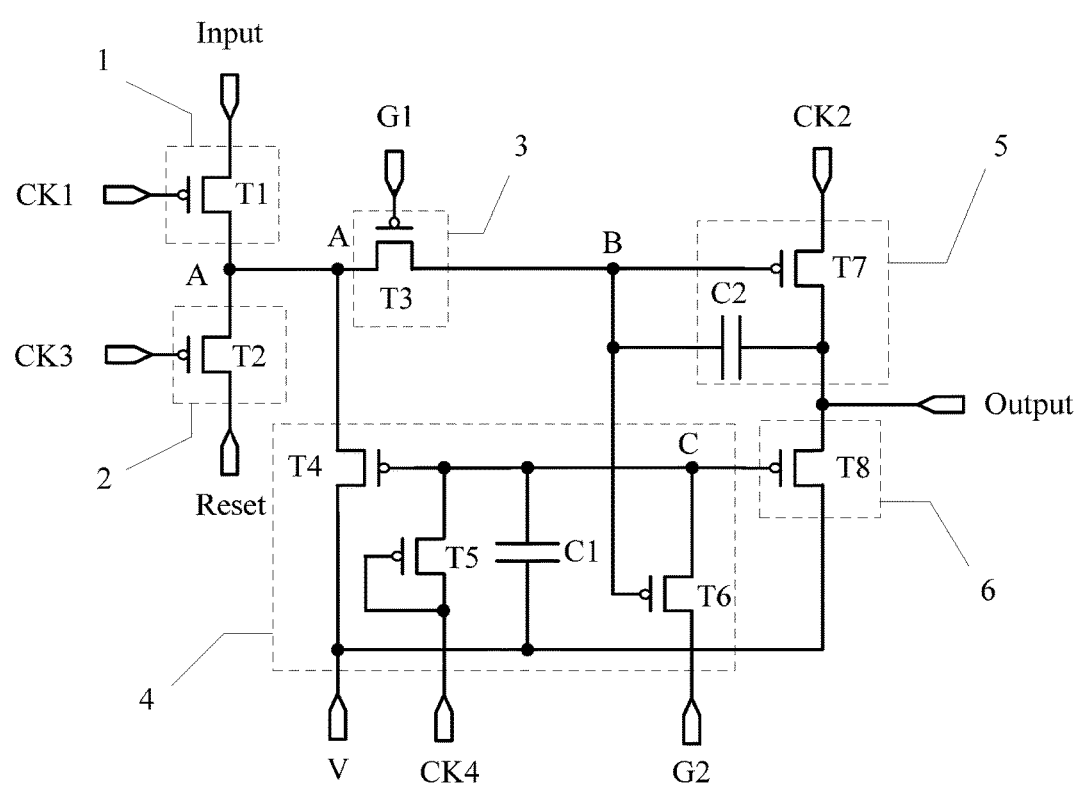
FIG. 4b is still yet another specific schematic view showing the shift register in FIG. 1b.

As shown in FIGS. 2a-3d, a gate electrode of the first switch transistor T1 is configured to receive the input signal Input and a source electrode thereof is configured to receive the first clock signal CK1, or as shown in FIGS. 4a and 4b, the gate electrode of the first switch transistor T1 is configured to receive the first clock signal CK1 and the source electrode thereof is configured to receive the input signal Input.

Optionally, during the implementation, in the case that the valid pulse signal of the input signal Input is at a high potential, as shown in FIGS. 2a, 3a, 3c and 4a, the first switch transistor T1 may be an N-type switch transistor, and in the case that the valid pulse signal of the input signal Input is at a low potential, as shown in FIGS. 2b, 3b, 3d and 4b, the first switch transistor T1 may be a P-type switch transistor. The structure of the first switch transistor T1 is not particularly defined herein.

Further, during the implementation, in the case that the input signal Input and the first clock signal CK1 are both at the first potential, the first node A may be at the first potential through the first switch transistor T1.

The above is merely an example of the structure of the input module in the shift register. During the implementation, the input module may be of any other known structure for a person skilled in the art under the teaching of the present disclosure, which will not be particularly defined herein.

Optionally, in the shift register, as shown in FIGS. 2a-4b, the resetting module 2 may include a second switch transistor T2, a drain electrode of which is connected to the first node A.

As shown in FIGS. 2a-3d, a gate electrode of the second switch transistor T2 is configured to receive the resetting signal Reset and a source electrode thereof is configured to receive the third clock signal CK3, or as shown in FIGS. 4a and 4b, the gate electrode of the second switch transistor T2 is configured to receive the third clock signal CK3 and the source electrode thereof is configured to receive the resetting signal Reset.

Optionally, during the implementation, in the case that the valid pulse signal of the input signal Input is at a high potential, as shown in FIGS. 2a, 3a, 3c and 4a, the second switch transistor T2 may be an N-type switch transistor, or in the case that the valid pulse signal of the input signal Input is at a low potential, as shown in FIGS. 2b, 3b, 3d and 4b, the second switch transistor T2 may be a P-type switch transistor. The structure of the second switch transistor T2 is not particularly defined herein.

Further, during the implementation, in the case that the resetting signal Reset and the third clock signal CK3 are both at the first potential, the first node A may be at the first potential through the second switch transistor T2.

The above is merely an example of the structure of the resetting module in the shift register, and during the implementation, the resetting module may be of any other known structure for a person skilled in the art under the teaching of the present disclosure, which will not be particularly defined herein.

Optionally, in the shift register, as shown in FIGS. 2a-4b, the touch switching module 3 may include a third switch transistor T3, a gate electrode of which is configured to receive the first touch-control signal G1, a source electrode of which is connected to the first node A, and a drain electrode of which is connected to the second node B.

Optionally, during the implementation, in the case that the valid pulse signal of the input signal Input is at a high potential, as shown in FIGS. 2a, 3a, 3c and 4a, the third switch transistor T3 may be an N-type switch transistor, or in the case that the valid pulse signal of the input signal Input is at a low potential, as shown in FIGS. 2b, 3b, 3d and 4b, the third switch transistor T3 may be a P-type switch transistor. The structure of the third switch transistor T3 is not particularly defined herein.

Further during the implementation, the third switch transistor T3 is in an on state at the display stage under the control of the first touch-control signal G1 so as to enable the first node A to be electrically connected to the second node B. In addition, the third switch transistor T3 is in an off state at the touch stage under the control of the first touch-control signal G1, so as to enable the first node A to be electrically disconnected from the second node B.

The above is merely an example of the structure of the touch switching module in the shift register, and during the implementation, the touch switching module may be of any other known structure for a person skilled in the art under the teaching of the present disclosure, which will not be particularly defined herein.

Optionally, in the shift register, as shown in FIGS. 2a-4b, the node control module 4 may include a fourth switch transistor T4, a fifth switch transistor T5, a sixth switch transistor T6 and a first capacitor C1. A gate electrode of the fourth switch transistor T4 is connected to the third node C, a source electrode thereof is configured to receive the DC signal V, and a drain electrode thereof is connected to the first node A. A gate electrode and a source electrode of the fifth switch transistor T5 are configured to receive the fourth clock signal CK4, and a drain electrode thereof is connected to the third node C. A gate electrode of the sixth switch transistor T6 is connected to the second node B, a source electrode thereof is configured to receive the second touch-control signal G2, and a drain electrode thereof is connected to the third node C. One end of the first capacitor C1 is connected to the third node C, and the other end thereof is configured to receive the DC signal V.

Optionally, during the implementation, in the case that the valid pulse signal of the input signal Input is at a high potential, as shown in FIGS. 2a, 3a, 3c and 4a, the fourth switch transistor T4, the fifth switch transistor T5 and the sixth switch transistor T6 may be N-type switch transistors, or in the case that the valid pulse signal of the input signal Input is at a low potential, as shown in FIGS. 2b, 3b, 3d and 4b, the fourth switch transistor T4, the fifth switch transistor T5 and the sixth switch transistor T6 may be P-type switch transistors. The structure of the fourth switch transistor T4 is not particularly defined herein.

Further, during the implementation, in the case that the fourth switch transistor T4 is in the on state under the control of the potential at the third node C, the DC signal V may be applied to the first node A. In the case that the fifth switch transistor T5 is in the on state under the control of the fourth clock signal CK4, the fourth clock signal CK4 may be applied to the third node C. In the case that the sixth switch transistor T6 is in the on state under the control of the second node B, the second touch-control signal G2 may be applied to the third node C. In the case that the third node C is in the floating state, due to a bootstrapping effect of the capacitor, a voltage difference between the source electrode of the fourth switch transistor T4 and the third node C may be maintained to the voltage different within the previous time period.

The above is merely an example of the structure of the node control module in the shift register, and during the implementation, the node control module may be of any other known structure for a person skilled in the art under the teaching of the present disclosure, which will not be particularly defined herein.

Optionally, in the shift register, as shown in FIGS. 2a-4b, the first output module 5 may include a seventh switch transistor T7 and a second capacitor C2. A gate electrode of the seventh switch transistor T7 is connected to the second node B, a source electrode thereof is configured to receive the second clock signal CK2, and a drain electrode thereof is connected to the driving signal output end Output. One end of the second capacitor C2 is connected to the second node B, and the other end thereof is connected to the driving signal output end Output.

Optionally, during the implementation, in the case that the valid pulse signal of the input signal Input is at a high potential, as shown in FIGS. 2a, 3a, 3c and 4a, the seventh switch transistor T7 may be an N-type switch transistor, or in the case that the valid pulse signal of the input signal Input is at a low potential, as shown in FIGS. 2b, 3b, 3d and 4b, the seventh switch transistor T7 may be a P-type switch transistor. The structure of the seventh switch transistor T7 is not particularly defined herein.

Further, during the implementation, in the case that the seventh switch transistor T7 is in the on state under the control of the second node B, the second clock signal CK2 may be applied to the driving signal output end Output. In the case that the second node B is in the floating state, due to the bootstrapping effect of the second capacitor C2, a voltage difference between the second node B and the driving signal output end Output may be maintained to be the voltage difference within the previous time period.

The above is merely an example of the structure of the first output module in the shift register, and during the implementation, the first output module may be of any other known structure for a person skilled in the art under the teaching of the present disclosure, which will not be particularly defined herein.

Optionally, in the shift register, as shown in FIGS. 2a-4b, the second output module 6 may include an eighth switch transistor T8, a gate electrode of which is connected to the third node C, a source electrode of which is configured to receive the DC signal V, and a drain electrode of which is connected to the driving signal output end Output.

Optionally, during the implementation, in the case that the valid pulse signal of the input signal Input is at a high potential, as shown in FIGS. 2a, 3a, 3c and 4a, the eighth switch transistor T8 may be an N-type switch transistor, or in the case that the valid pulse signal of the input signal Input is at a low potential, as shown in FIGS. 2b, 3b, 3d and 4b, the eighth switch transistor T8 may be a P-type switch transistor. The structure of the eighth switch transistor T8 is not particularly defined herein.

Further, during the implementation, in the case that the eighth switch transistor T8 is in the on state under the control of the potential at the third node C, the DC signal V may be applied to the driving signal output end Output.

The above is merely an example of the structure of the second output module in the shift register, and during the implementation, the second output module may be of any other known structure for a person skilled in the art under the teaching of the present disclosure, which will not be particularly defined herein.

Optionally, during the implementation, as shown in FIGS. 3a-3d, the third output module 7 may include a ninth switch transistor T9. As shown in FIGS. 3a and 3b, a gate electrode of the ninth switch transistor T9 is configured to receive the third touch-control signal G3, a source electrode thereof is configured to receive the DC signal V, and a drain electrode thereof is connected to the driving signal output end Output.

Optionally, during the implementation, as shown in FIG. 3a, the ninth switch transistor T9 may be an N-type switch transistor, or as shown in FIG. 3b, the ninth switch transistor T9 may be a P-type switch transistor. The structure of the ninth switch transistor T9 is not particularly defined herein.

Further, during the implementation, in the case that the ninth switch transistor T9 is in the on state under the control of the third touch-control signal G3, the DC signal V may be applied to the driving signal output end Output at the touch stage.

Further, during the implementation, the second touch-control signal G2 and the third touch-control signal G3 may be a same touch-control signal. As shown in FIGS. 3c and 3d, the gate electrode of the ninth switch transistor T9 may be configured to receive the second touch-control signal G2, the source electrode thereof may be configured to receive the DC signal V, and the drain electrode thereof may be connected to the driving signal output end Output.

Optionally, during the implementation, in the case that the valid pulse signal of the input signal Input is at a high potential, as shown in FIG. 3c, the ninth switch transistor T9 may be an N-type switch transistor, or in the case that the valid pulse signal of the input signal Input is at a low potential, as shown in FIG. 3d, the ninth switch transistor T9 may be a P-type switch transistor. The structure of the ninth switch transistor T9 is not particularly defined herein.

The above is merely an example of the structure of the third output module in the shift register, and during the implementation, the third output module may be of any other known structure for a person skilled in the art under the teaching of the present disclosure, which will not be particularly defined herein.

Optionally, in the embodiments of the present disclosure, usually the switch transistors may be made of an identical material. During the implementation, in the case that the valid pulse signal of the input signal is at a high potential, all of the switch transistors may be N-type transistors, and in the case that the valid pulse signal of the input signal is at a low potential, all of the switch transistors may be P-type transistors.

Further, during the implementation, the N-type switch transistor may be in the on state under the effect of a high potential, and in the off state under the effect of a low potential. The P-type switch transistor may be in the off state under the effect of a high potential, and in the on the state under the effect of a low potential.

It should be appreciated that, the above-mentioned switch transistors may be metal oxide semiconductor field effect transistors (MOSFETs). During the implementation, the source electrode and the drain electrode of each transistor may be replaced with each other in terms of the function, depending on the type of the transistor and the input signal.

Further, in some embodiments of the present disclosure, the input module and the resetting module may be designed symmetrically and they may be replaced with each other in terms of the function, so the shift register may be used for bidirectional scanning. During the backward scanning, the input module and the resetting module may be replaced with each other in terms of the function, i.e., as compared with the forward scanning, the resetting module may serve as the input module and the resetting signal may serve as the input signal, while the input module may serve as the resetting module and the input signal may serve as the resetting signal. In addition, in the case that the valid pulse signal of the resetting signal is at a high potential, the rising edge of the resetting signal may be flush with the rising edge of the third clock signal, the rising edge of the input signal may be flush with the rising edge of the first clock signal, the falling edge of the third clock signal may be flush with the rising edge of the second clock signal and the falling edge of the resetting signal, the falling edge of the second clock signal may be flush with the rising edge of the first clock signal, the falling edge of the first clock signal may be flush with the rising edge of the fourth clock signal and the falling edge of the input signal, and the falling edge of the fourth clock signal may be flush with the rising edge of the third clock signal. In the case that the valid pulse signal of the resetting signal is at a low potential, the falling edge of the resetting signal may be flush with the falling edge of the third clock signal, the falling edge of the input signal may be flush with the falling edge of the first clock signal, the rising edge of the third clock signal may be flush with the falling edge of the second clock signal and the rising edge of the resetting signal, the rising edge of the second clock signal may be flush with the falling edge of the first clock signal, the rising edge of the first clock signal may be flush with the falling edge of the fourth clock signal and the rising edge of the input signal, and the rising edge of the fourth clock signal may be flush with the falling edge of the third clock signal.

An operation procedure of the shift register will be described hereinafter by taking the forward scanning as an example in conjunction with the timing sequence diagrams. In the following, 1 represents a high potential signal, and 0 represents a low potential signal.

Figure 5A:
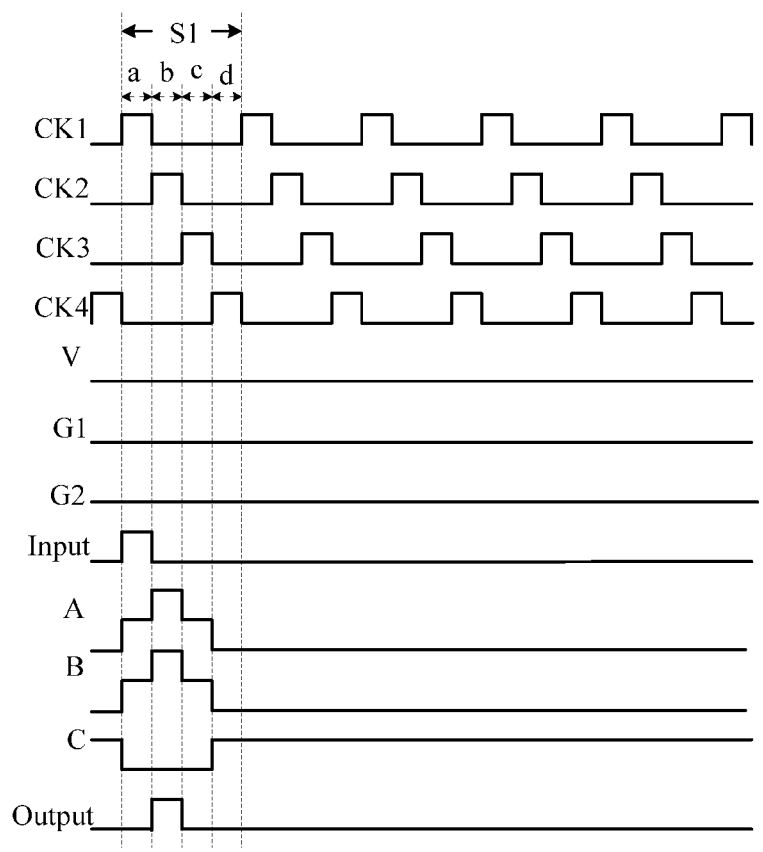

In some embodiments of the present disclosure, the operation procedure will be described by taking the shift register in FIG. 2a as an example. In FIG. 2a, all of the switch transistors are N-type switch transistors, each of which is in the on state under the effect of a high potential, and in the off state under the effect of a low potential. The DC signal V is at a low potential, the first touch-control signal G1 is at a high potential at the display stage, and the second touch-control signal G2 is at a low potential at the display stage. FIG. 5a shows the timing sequence of the signals. To be specific, a display stage S1 in FIG. 5a is selected, and it includes four stages a, b, c and d.

At the display stage S1, G1=1, G2=0, and V=0. Because G1=1, the third switch transistor T3 may be in the on state, such that the first node A may be electrically connected to the second node B.

At the stage a, CK1=1, CK2=0, CK3=0, CK4=0, Input=1, and Reset=0. Because Input=1, the first switch transistor T1 is in the on state, so as to apply the potential of the input signal Input to the first node A, and at this time, the first node A is at a high potential. Because Reset=0, the second switch transistor T2 is in the off state. The first node A is electrically connected to the second node B, so the second node B is at the high potential, so as to turn on the sixth switch transistor T6 and the seventh switch transistor T7. At this time, since the second node B is at the high potential, the second touch-control signal G2 at a low potential is applied to the third node C through the sixth switch transistor T6, so as to enable the third node C to be at a low potential. At this time, since the third node C is at the low potential, the fourth switch transistor T4 and the eighth switch transistor T8 are in the off state. Because CK4=0, the fifth switch transistor T5 is in the off state. Since the seventh switch transistor 7 is in the on state, the second clock signal CK2 at a low potential is applied to the driving signal output end Output through the seventh switch transistor T7, so as to charge the second capacitor C2, and enable the driving signal output end Output to output a scanning signal at a low potential.

At the stage b, CK1=0, CK2=1, CK3=0, CK4=0, Input=0, and Reset=0. Because Input=0, the first switch transistor T1 is in the off state. Because Reset=0, the second switch transistor T2 is in the off state. Because CK4=0, the fifth switch transistor T5 is in the off state. The second node B is in the floating state, the potential at the second node B is further pulled up due to the bootstrapping effect of the second capacitor C2, so as to maintain the voltage difference across the second capacitor C2, and thus maintain the sixth switch transistor T6 and the seventh switch transistor T7 to be in the on state at this stage. At this time, since the sixth switch transistor T6 is in the on state and thus the second touch-control signal G2 at the low potential is applied to the third node C through the sixth switch transistor T6, the third node C is at the low potential, so as to turn off the fourth switch transistor T4 and the eighth switch transistor T8. Since the seventh transistor T7 is in the on state, the second clock signal CK2 at a high potential is applied to the driving signal output end Output through the seventh switch transistor T7, so as to enable the driving signal output end Output to output a scanning signal at a high potential.

At the stage c, CK1=0, CK2=0, CK3=1, CK4=0, Input=0, and Reset=1. Because Input=0, the first switch transistor T1 is in the off state. Because Reset=1, the second switch transistor T2 is in the on state and the potential of the resetting signal is applied to the first node A, such that the first node A is at a high potential. The first node A is electrically connected to the second node B, so the second node B is at a high potential, and thus the sixth switch transistor T6 and the seventh switch transistor T7 are both in the on state. At this time, since the sixth switch transistor T6 is in the on state and thus the second touch-control signal G2 at a low potential is applied to the third node C through the sixth switch transistor T6, the third node C is at a low potential, and thus the fourth switch transistor T4 and the eighth switch transistor T8 are both in the off state. Because CK4=0, the fifth switch transistor T5 is in the off state. The seventh switch transistor T7 is in the on state and thus the second clock signal CK2 at a low potential is applied to the driving signal output end Output through the seventh switch transistor T7, so as to charge the first capacitor C1 and enable the driving signal output end Output to output a scanning signal at a low potential.

At the stage d, CK1=0, CK2=0, CK3=0, CK4=1, Input=0 and Reset=0. Because Input=0, the first switch transistor T1 is in the off state. Because Reset=0, the second switch transistor T2 is in the off state. Because CK4=1, the fifth switch transistor T5 is in the on state. At this time, the fourth clock signal CK4 at a high potential is applied to the third node C through the fifth switch transistor T5, and thus the third node C is at a high potential so as to charge the first capacitor C1. Because the third node C is at a high potential, the fourth switch transistor T4 and the eighth switch transistor T8 are both in the on state. At this time, the DC signal V at a low potential is applied to the first node A through the fourth switch transistor T4, and the first node A is at a low potential. The first node A is electrically connected to the second node B, so the second node B is at a low potential, and thus the sixth switch transistor T6 and the seventh switch transistor T7 are both in the off state. The eighth switch transistor T8 is in the on state and thus the DC signal V at a low potential is applied to the driving signal output end Output through the eighth switch transistor T8, so as to enable the driving signal output end Output to output a scanning signal at a low potential.

After the stage d, V=0, G1=1, G2=1, Input=0, and Reset=0. Because Input=0, the first switch transistor T1 is in the off state. Because Reset=0, the second switch transistor T2 is in the off state. In the case that CK4=3, CK4=3 and CK3=1, the third node C is in the floating state. Due to the bootstrapping effect of the first capacitor C1, the third node C is maintained at a high potential, so as to maintain the voltage difference across the first capacitor C1, and thus maintain the fourth switch transistor T4 and the eighth switch transistor T8 to be in the on state at this stage. In the case that CK4=1, the first capacitor C1 starts to be charged. Since the fourth switch transistor T4 is in the on state and thus the DC signal V at a low potential is applied to the first node A through the fourth switch transistor T4, the first node A is at a low potential. The first node A is electrically connected to the second node B, so the second node B is at a low potential too, and at this time, the sixth switch transistor T6 and the seventh switch transistor T7 are both in the off state. The eighth switch transistor T8 is in the on state and thus the DC signal V at a low potential is applied to the driving signal output end Output through the eighth switch transistor T8, so as to enable the driving signal output end Output to output a scanning signal at a low potential.

In some embodiments of the present disclosure, after the stage d of the display stage S1 is ended, the first capacitor C1 starts to be charged every time that CK4=1, so as to maintain the third node C to be at a high potential through the first capacitor C1 in the case that CK1=1, CK2=1 and CK3=1, and enable the fourth switch transistor T4 and the eighth switch transistor T8 to be in the on state, thereby ensure the driving signal output end Output to output a scanning signal at a low potential until a next image frame comes.

Figure 5B:
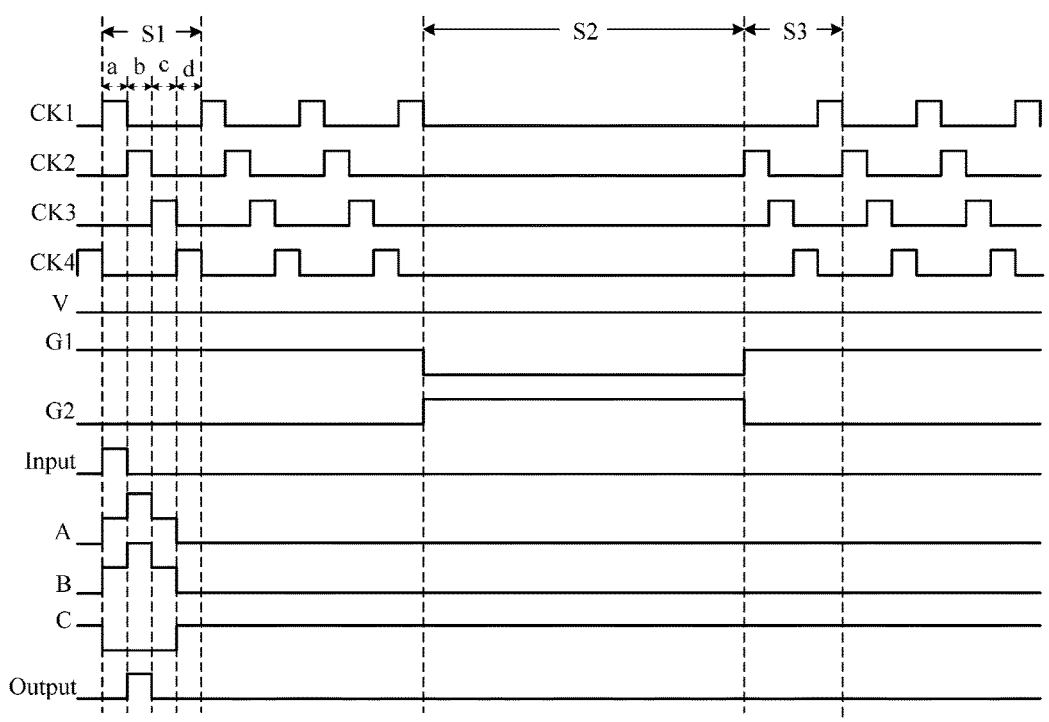

In some embodiments of the present disclosure, the operation procedure will be described by taking the shift register in FIG. 2a. Based on the above, a touch stage S2 may be provided after the stage d of the display stage S1. The first touch-control signal G1 is at a low potential at the touch stage, and the second touch-control signal G2 is at a high potential at the touch stage. FIG. 5b shows a corresponding timing sequence of the signals. To be specific, the display stage S1, the touch stage S2 and a display stage S3 in FIG. 5b may be selected, and the display stage S1 may include four stages a, b, c and d.

At the display stage S1, G1=1, G2=0, and V=0. Because G1=1, the third switch transistor T3 is in the on state, so as to enable the first node A to be electrically connected to the second node B.

At the stage a, CK1=1, CK2=0, CK3=0, CK4=0, Input=1, and Reset=0. The operation procedure at this stage may be identical to that at the stage a of the display stage S1 mentioned above in FIG. 5a, and thus will not be particularly defined herein.

At the stage b, CK1=0, CK2=1, CK3=0, CK4=0, Input=0, and Reset=0. The operation procedure at this stage may be identical to that at the stage b of the display stage S1 mentioned above in FIG. 5a, and thus will not be particularly defined herein.

At the stage c, CK1=0, CK2=0, CK3=1, CK4=0, Input=0, and Reset=1. The operation procedure at this stage may be identical to that at the stage c of the display stage S1 mentioned above in FIG. 5a, and thus will not be particularly defined herein.

At the stage d, CK1=0, CK2=0, CK3=0, CK4=1, Input=0, and Reset=0. The operation procedure at this stage may be identical to that at the stage d of the display stage S1 mentioned above in FIG. 5a, and thus will not be particularly defined herein.

After the stage d, V=0, G1=1, G2=1, Input=0, and Reset=0. The operation procedure at this stage may be identical to that after the stage d of the display stage S1 mentioned above in FIG. 5a, and thus will not be particularly defined herein.

At the touch stage S2, CK1=0, CK2=0, CK3=0, CK4=0, G1=0, G2=1, V=0, Input=0, and Reset=0. Because G1=0, the third switch transistor T3 is in the off state, and the first node A is electrically disconnected from the node B. Because Input=0, the first switch transistor T1 is in the off state. Because Reset=0, the second switch transistor T2 is in the off state. The third node C is in the floating state, so the third node C is maintained at a high potential due to the bootstrapping effect of the first capacitor C1, so as to maintain the voltage difference across the first capacitor C1, and thus maintain the fourth switch transistor T4 and the eighth switch transistor T8 to be in the on state at this stage. Since the fourth switch transistor T4 is in the on state and thus the DC signal V at a low potential is applied to the first node A through the fourth switch transistor T4, and at this time, the first node A is at a low potential. Because the first node A is electrically disconnected from the second node B, the second node B is maintained at a low potential, and the sixth switch transistor T6 and the seventh switch transistor T7 are both in the off state. The eighth switch transistor T8 is in the on state and thus the DC signal V at a low potential is applied to the driving signal output end Output through the eighth switch transistor T8, so as to enable the driving signal output end Output to output a scanning signal at a low potential.

At the display stage S3, V=0, G1=1, G2=1, Input=0, and Reset=0. Because Input=0, the first switch transistor T1 is in the off state. Because Reset=0, the second switch transistor T2 is in the off state. In the case that CK4=3, CK4=3 and CK3=1, the third node C is in the floating state, so the third node C is maintained at a high potential due to the bootstrapping effect of the first capacitor C1, so as to maintain the voltage difference across the first capacitor C1, and enable the fourth switch transistor T4 and the eighth switch transistor T8 to be in the on state at this stage. Every time that CK4=1, the first capacitor C1 starts to be charged. Since the first switch transistor T4 is in the on state and thus the DC signal V at a low potential is applied to the first node A through the fourth switch transistor T4, the first node A is at a low potential. Because the first node A is electrically connected to the second node B, the second node B is at a low potential too, and thus the sixth switch transistor T6 and the seventh switch transistor T7 are both in the off state. The eighth switch transistor T8 is in the on state and the DC signal V at a low potential is applied to the driving signal output end Output through the eighth switch transistor T8, so as to enable the driving signal output end Output to output a scanning signal at a low potential. It is found that, the operation procedure at the display stage S3 is identical to that after the stage d of the display stage S1, and thus a description thereof is not repeated herein.

In some embodiments of the present disclosure, merely eight switch transistors are required so as to enable the driving signal output end Output to output the scanning signal at a low potential at the touch stage based on the operation procedure of FIG. 5a, with the touch stage S2 being provided after the stage d of the display stage S1. After the touch stage is ended, the subsequent operation procedure after the stage d of the display stage S1 may be performed.

Figure 5C:
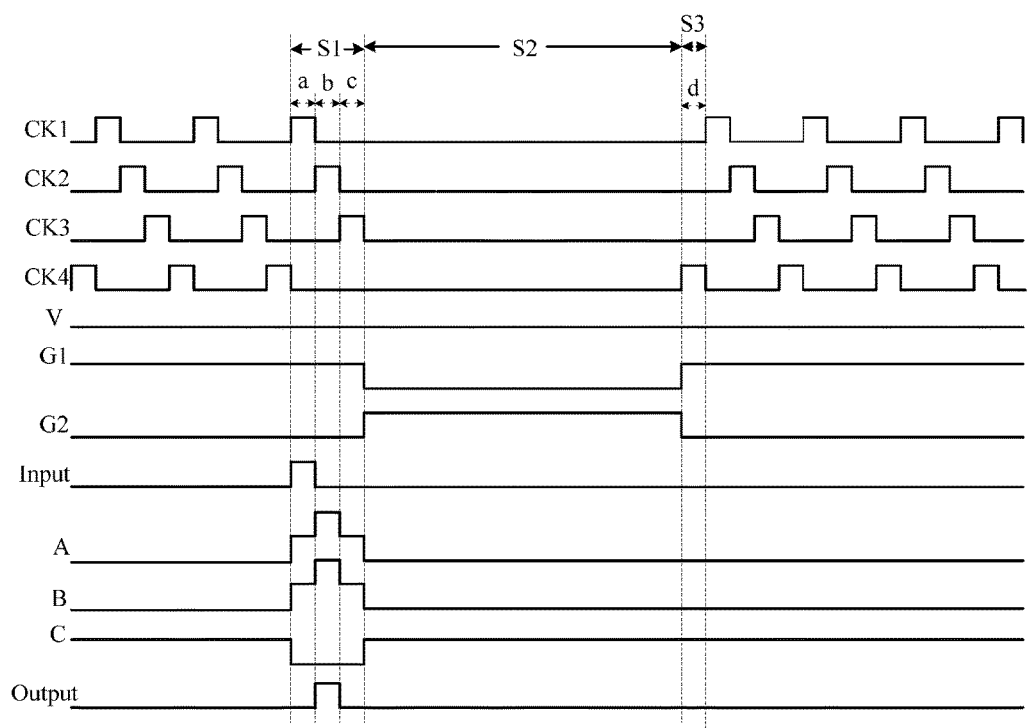

In some embodiments of the present disclosure, the operation procedure will be described by taking the shift register in FIG. 2a as an example, and based on the above, the touch stage S2 may be provided between the stages c and d of the display stage S1 based on the above embodiments of the present disclosure. The first touch-control signal G1 is at a low potential at the touch stage, and the second touch-control signal G2 is at a high potential at the touch stage. FIG. 5c shows a corresponding timing sequence of the signals. To be specific, the display stage S1, the touch stage S2 and the display stage S3 in FIG. 5c may be selected, and the display stage S1 may include three stages a, b and c, and the display stage S3 may include the stage d.

At the stage a of the display stage S1, CK1=1, CK2=0, CK3=0, CK4=0, Input=1, and Reset=0. The operation procedure at this stage may be identical to that at the stage a of the display stage S1 mentioned above in FIG. 5a, and thus a description thereof is not repeated herein.

At the stage b, CK1=0, CK2=1, CK3=0, CK4=0, Input=0, and Reset=0. The operation procedure at this stage may be identical to that at the stage b of the display stage S1 mentioned above in FIG. 5a, and thus a description thereof is not repeated herein.

At the stage c, CK1=0, CK2=0, CK3=1, CK4=0, Input=0, and Reset=1. The operation procedure at this stage may be identical to that at the stage c of the display stage S1 mentioned above in FIG. 5a, and thus a description thereof is not repeated herein.

At the touch stage S2, CK1=0, CK2=0, CK3=0, CK4=0, G1=0, G2=1, V=0, Input=0, and Reset=0. Because G1=0, the third switch transistor T3 is in the off state, and the first node A is electrically disconnected from the node B. Because Input=0, the first switch transistor T1 is in the off state. Because Reset=0, the second switch transistor T2 is in the off state. Because the first node A is electrically disconnected from the second node B, the second node B is in the floating state, and due to the bootstrapping effect of the second capacitor C2, the second node B is maintained at a high potential to maintain the voltage difference across the second capacitor C2, so as to turn on the sixth switch transistor T6. At this time, since the sixth switch transistor T6 is turned on and thus the second touch-control signal G2 at a low potential is applied to the third node C through the sixth switch transistor T6, so the third node C is at a high potential too, and thus the fourth switch transistor T4 and the eighth switch transistor T8 are both in the on state. Since the fourth switch transistor T4 is in the on state and thus the DC signal V at a low potential is applied to the first node A through the fourth switch transistor T4, the first node A is at a low potential. Since the eighth switch transistor T8 is in the on state and thus the DC signal V at a low potential is applied to the driving signal output end Output through the eighth switch transistor T8, it enables the driving signal output end Output to output a scanning signal at a low potential.

At the stage d of the display stage S3, CK1=0, CK2=0, CK3=0, CK4=1, Input=0, and Reset=0. Because Input=0, the first switch transistor T1 is in the off state. Because Reset=0, the second switch transistor T2 is in the off state. Because CK4=1, the fifth switch transistor T5 is in the on state. At this time, since the fifth switch transistor T5 is in the on state and thus the fourth clock signal CK4 at a high potential is applied to the third node C through the fifth switch transistor T5, the third node C is at a high potential so as to charge the first capacitor C1. Because the third node C is at a high potential, the fourth switch transistor T4 and the eighth switch transistor T8 are both in the on state. Since the fourth switch transistor T4 is in the on state and thus the DC signal V at a low potential is applied to the node A through the fourth switch transistor T4, the first node A is at a low potential. The first node A is electrically connected to the second node B, so the second node B is at a low potential too, and thus the sixth switch transistor T6 and the seventh switch transistor T7 are both in the off state. Since the eighth switch transistor T8 is in the on state and thus the DC signal V at a low potential is applied to the driving signal output end Output through the eighth switch transistor T8, it enables the driving signal output end Output to output a scanning signal at a low potential. It is found that, the operation procedure at the stage d of the display stage S3 is identical to that at the stage d of the display stage S1 in FIG. 5a.

After the stage d is ended, V=0, G1=1, G2=1, Input=0, and Reset=0. The operation procedure at this stage is identical to that after the stage d of the display stage S1 in FIG. 5a, and thus a description thereof is not repeated herein.

In some embodiments of the present disclosure, merely eight switch transistors are required so as to enable the driving signal output end Output to output the scanning signal at a low potential at the touch stage based on the operation procedure of FIG. 5a, with the touch stage S2 being provided between the stages c and d of the display stage S1.

Figure 5D:
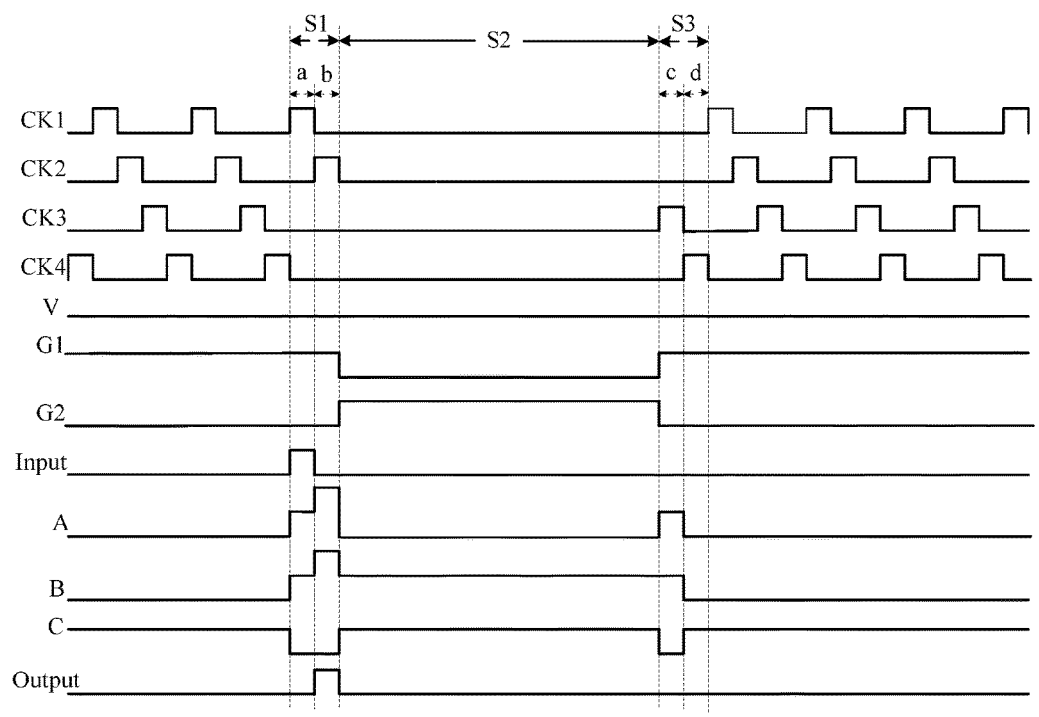

In some embodiments of the present disclosure, the operation procedure will be described by taking the shift register in FIG. 2a as an example, and based on the above embodiments of FIG. 5a, the touch stage S2 may be provided between the stages b and c of the display stage S1. The first touch-control signal G1 is at a low potential at the touch stage, and the second touch-control signal G2 is at a high potential at the touch stage. FIG. 5d shows a corresponding timing sequence of the signals. To be specific, the display stage S1, the touch stage S2 and the display stage S3 in FIG. 5d may be selected, and the display stage S1 may include two stages a and b, and the display stage S3 may include two stages c and d.

At the stage a of the display stage S1, CK1=1, CK2=0, CK3=0, CK4=0, Input=1, and Reset=0. The operation procedure at this stage may be identical to that at the stage a of the display stage S1 mentioned above in FIG. 5a, and thus a description thereof is not repeated herein.

At the stage b, CK1=0, CK2=1, CK3=0, CK4=0, Input=0, and Reset=0. The operation procedure at this stage may be identical to that at the stage b of the display stage S1 mentioned above in FIG. 5a, and thus a description thereof is not repeated herein.

At the touch stage S2, CK1=0, CK2=0, CK3=0, CK4=0, G1=0, G2=1, V=0, Input=0, and Reset=0. Because G1=0, the third switch transistor T3 is in the off state, and thus the first node A is electrically disconnected from the node B. Because Input=0, the first switch transistor T1 is in the off state. Because Reset=0, the second switch transistor T2 is in the off state. The second node B is in the floating state, and due to the bootstrapping effect of the second capacitor C2, the second node B is maintained at a high potential, so as to maintain the voltage difference across the second capacitor C2, and thus maintain the sixth switch transistor T6 and the seventh switch transistor T7 to be in the on state at this stage. Since the sixth switch transistor T6 is in the on state and thus the second touch-control signal G2 at a high potential is applied to the third node C through the sixth switch transistor T6, the third node C is at a high potential too, and thus the fourth switch transistor T4 and the eighth switch transistor T8 are both in the on state. Since the eighth switch transistor T8 is in the on state and thus the DC signal V at a low potential is applied to the driving signal output end Output through the eighth switch transistor T8, it enables the driving signal output end Output to output a scanning signal at a low potential.

At the stage c of the display stage S3, CK1=0, CK2=0, CK3=1, CK4=0, Input=0, and Reset=1. Because Input=0, the first switch transistor T1 is in the off state. Because Reset=1, the second switch transistor T2 is in the on state so as to apply the potential of the resetting signal to the first node A. At this time, the first node A is at a high potential. The first node A is electrically connected to the second node B, so the second node B is at a high potential too, and thus the sixth switch transistor T6 and the seventh switch transistor T7 are both in the on state. Since the sixth switch transistor T6 is in the on state and thus the second touch-control signal G2 at a low potential is applied to the third node C through the sixth switch transistor T6, the third node C is at a low potential, and thus the fourth switch transistor T4 and the eighth switch transistor T8 are both in the off state. Because CK4=0, the fifth switch transistor T5 is in the off state. Since the seventh switch transistor T7 is in the on state and thus the second clock signal CK2 at a low potential is applied to the driving signal output end Output through the seventh switch transistor T7, it enables the driving signal output end Output to output a scanning signal at a low potential. It is found that, the operation procedure at the stage c of the display stage S3 is identical to that at the stage c of the display stage S1 in FIG. 5a, and thus a description thereof is not repeated herein.

At the stage d, CK1=0, CK2=0, CK3=0, CK4=1, Input=0, and Reset=0. Because Input=0, the first switch transistor T1 is in the off state. Because Reset=0, the second switch transistor T2 is in the off state. Because CK4=1, the fifth switch transistor T5 is in the on state, and thus the fourth clock signal CK4 at a high potential is applied to the third node C through the fifth switch transistor T5, the third node C is at a high potential and the first capacitor C1 starts to be charged. Because the third node C is at a high potential, the fourth switch transistor T4 and the eighth switch transistor T8 are both in the on state. Since the fourth switch transistor T4 is in the on state, and thus the DC signal V at a low potential is applied to the first node A through the fourth switch transistor T4, the first node A is at a low potential. The first node A is electrically connected to the second node B, so the second node B is at a low potential too, and thus the sixth switch transistor T6 and the seventh switch transistor T7 are both in the off state. Since the eighth switch transistor T8 is in the on state, and thus the DC signal V at a low potential is applied to the driving signal output end Output through the eighth switch transistor T8, it enables the driving signal output end Output to output a scanning signal at a low potential. It is found that, the operation procedure at the stage d of the display stage S3 is identical to that at the stage d of the display stage S1 in FIG. 5a, and thus a description thereof is not repeated herein.

After the stage d is ended, V=0, G1=1, G2=1, Input=0, and Reset=0. The operation procedure at this stage is identical to that after the stage d of the display stage S1 in FIG. 5a, and thus a description thereof is not repeated herein.

In some embodiments of the present disclosure, merely eight switch transistors are required so as to enable the driving signal output end Output to output the scanning signal at a low potential at the touch stage S2 based on the operation procedure of FIG. 5a, with the touch stage S2 being provided between the stages b and c of the display stage S1.

Figure 5E:
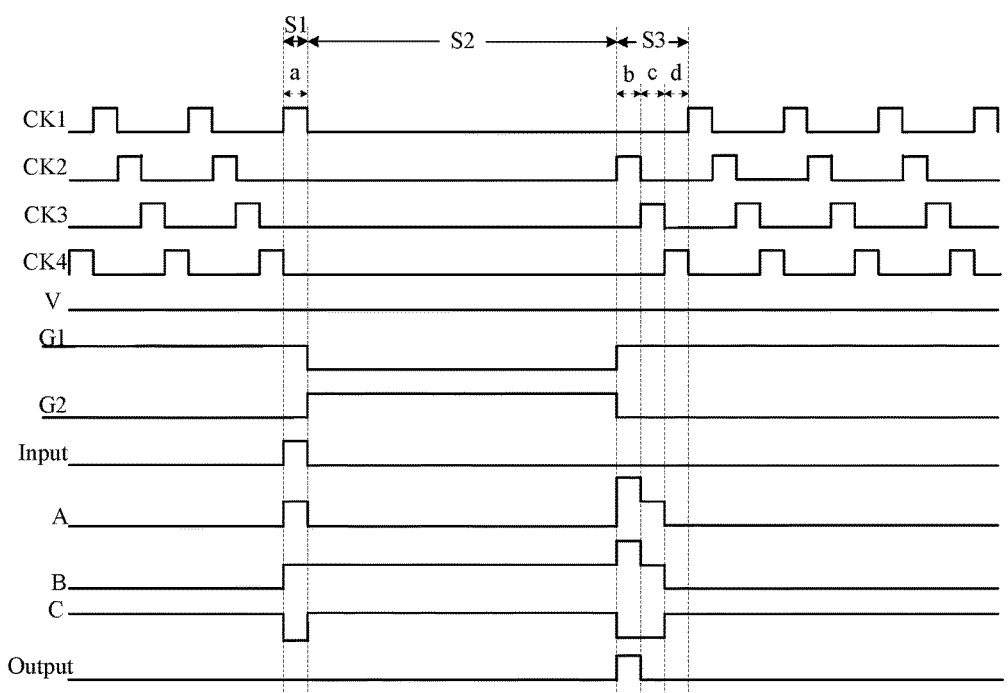

In some embodiments of the present disclosure, the operation procedure will be described by taking the shift register in FIG. 2a as an example, and based on the above embodiments of FIG. 5a, the touch stage S2 may be provided between the stages a and b of the display stage S1. The first touch-control signal G1 is at a low potential at the touch stage, and the second touch-control signal G2 is at a high potential at the touch stage. FIG. 5e shows a corresponding timing sequence of the signals. To be specific, the display stage S1, the touch stage S2 and the display stage S3 in FIG. 5e may be selected, and the display stage S1 may include a stage a, and the display stage S3 may include three stages b, c and d.

At the stage a of the display stage S3, CK1=1, CK2=0, CK3=0, CK4=0, Input=1, and Reset=0. The operation procedure at this stage may be identical to that at the stage a of the display stage S1 mentioned above in FIG. 5a, and thus a description thereof is not repeated herein.

At the touch stage S2, CK1=0, CK2=0, CK3=0, CK4=0, G1=0, G2=1, and V=0. Because G1=0, the third switch transistor T3 is in the off state, and the first node A is electrically disconnected from the second node B. The second node B is in the floating state, and due to the bootstrapping effect of the second capacitor C2, the second node B is maintained at a high potential, so as to maintain the voltage difference across the second capacitor C2, and thus maintain the sixth switch transistor T6 and the seventh switch transistor T7 to be in the on state at this stage. Since the sixth switch transistor T6 is in the on state and thus the second touch-control signal G2 at a high potential is applied to the third node C through the sixth switch transistor T6, the third node C is at a high potential, and thus the fourth switch transistor T4 and the eighth switch transistor T8 are both in the on state. Since the eighth switch transistor T8 is in the on state and thus the DC signal at a low potential is applied to the driving signal output end Output through the eighth switch transistor T8, it enables the driving signal output end Output to output a scanning signal at a low potential.

At the stage b of the display stage S3, CK1=0, CK2=1, CK3=0, CK4=0, Input=0, and Reset=0. Because input=0, the first switch transistor T1 is in the off state. Because Reset=0, the second switch transistor T2 is in the off state. Because CK4=0, the fifth switch transistor T5 is in the off state. The second node B is in the floating state, and due to the bootstrapping effect of the second capacitor C2, the potential at the second node B is further pulled up, so as to maintain the voltage difference across the second capacitor C2, and thus maintain the sixth switch transistor T6 and the seventh switch transistor T7 to be in the on state at this stage. Since the sixth switch transistor T6 is in the on state and thus the second touch-control signal G2 at a low potential is applied to the third node C through the sixth switch transistor T6, the third node C is at a low potential, and thus the fourth switch transistor T4 and the eight switch transistor T8 are both in the off state. Since the seventh switch transistor T7 is in the on state and thus the second clock signal CK2 at a high potential is applied to the driving signal output end Output through the seventh switch transistor T7, it enables the driving signal output end Output to output a scanning signal at a high potential. It is found that, the operation procedure at the stage b of the display stage S3 is identical to that at the stage b of the display stage S1 in FIG. 5a.

At the stage c, CK1=0, CK2=0, CK3=1, CK4=0, Input=0, and Reset=1. Because Input=0, the first switch transistor T1 is in the off state. Because Reset=1, the second switch transistor T2 is in the on state so as to apply the potential of the resetting signal to the first node A. At this time, the first node A is at a high potential. The first node A is electrically connected to the second node B, so the second node B is at a high potential too, and thus the sixth switch transistor T6 and the seventh switch transistor T7 are both in the on state. Since the sixth switch transistor T6 is in the on state and thus the second touch-control signal G2 at a low potential is applied to the third node C through the sixth switch transistor T6, so the third node C is at a low potential, and thus the fourth switch transistor T4 and the eighth switch transistor T8 are both in the off state. Because CK4=0, the fifth switch transistor T5 is in the off state. Since the seventh switch transistor T7 is in the on state and thus the second clock signal CK2 at a low potential is applied to the driving signal output end Output through the seventh switch transistor T7, it enables the driving signal output end Output to output a scanning signal at a low potential. It is found that, the operation procedure at the stage b of the display stage S3 is identical to that at the stage c of the display stage S1 in FIG. 5a.

At the stage d, CK1=0, CK2=0, CK3=0, CK4=1, Input=0, and Reset=0. Because Input=0, the first switch transistor T1 is in the off state. Because Reset=0, the second switch transistor T2 is in the off state. Because CK4=1, the fifth switch transistor T5 is in the on state. Since the fifth switch transistor T5 is in the on state and thus t fourth clock signal CK4 at a high potential is applied to the third node C through the fifth switch transistor T5, the third node C is at a high potential and the first capacitor C1 starts to be charged. Because the third node C is at a high potential, the fourth switch transistor T4 and the eighth switch transistor T8 are both in the on state. Since the fourth switch transistor T4 is in the on state and thus the DC signal V at a low potential is applied to the first node A through the fourth switch transistor T4, the first node A is at a low potential. The first node A is electrically connected to the second node B, so the second node B is at a low potential too, and thus the sixth switch transistor T6 and the seventh switch transistor T7 are both in the off state. Since the eighth switch transistor T8 is in the on state and thus the DC signal V at a low potential is applied to the driving signal output end Output through the eighth switch transistor T8, it enables the driving signal output end Output to output a scanning signal at a low potential. It is found that, the operation procedure at the stage b of the display stage S3 is identical to that at the stage d of the display stage S1 in FIG. 5a.

After the stage d, V=0, G1=1, G2=1, Input=0, and Reset=0. The operation procedure at this stage may be identical to that after the stage d of the display stage S1 mentioned above in FIG. 5a, and thus a description thereof is not repeated herein.

In some embodiments of the present disclosure, merely eight switch transistors are required so as to enable the driving signal output end Output to output the scanning signal at a low potential at the touch stage S2 based on the operation procedure of FIG. 5a, with the touch stage S2 being provided between the stages a and b of the display stage S1.

According to the shift register in the embodiments of the present disclosure, through the eight switch transistors, it is able to provide the touch stage between any two adjacent time periods of the display stage, it enables the driving signal output end of the shift register to output the DC signal at the touch stage, and enables the gate driver circuit to continue to achieve a display function after the touch stage is ended. As a result, it is able to provide the shift register with a simple structure for the narrow bezel, and to provide the touch period within any display period.

Based on an identical inventive concept, the present disclosure further provides in some embodiments a method for driving the above-mentioned shift register, which includes a display stage and a touch stage. The display stage includes a first stage, a second stage, a third stage and a fourth stage.

At the first stage, the input module is configured to apply the first clock signal to the first node under the control of the input signal, the touch switching module is configured to, under the control of the first touch-control signal, enable the first node to be electrically connected to the second node and apply a potential at the first node to the second node, the node control module is configured to, under the control of the potential at the second node, apply the second touch-control signal to the third node, and the first output module is configured to, under the control of the potential at the second node, apply the second clock signal to the driving signal output end.

At the second stage, the second node is in a floating state, the first output module is configured to maintain a voltage difference between the second node and the driving signal output end to be a voltage difference within a previous time period and apply, under the control of the potential at the second node, apply the second clock signal to the driving signal output end, and the node control module is configured to, under the control of the potential at the second node, apply the second touch-control signal to the third node.

At the third stage, the resetting module is configured to, under the control of the resetting signal, apply the third clock signal to the first node, the touch switching module is configured to, under the control of the first touch-control signal, enable the first node to be electrically connected to the second node and apply the potential at the first node to the second node, the node control module is configured to, under the control of the potential at the second node, apply the second touch-control signal to the third node, and the first output module is configured to, under the control of the potential at the second node, apply the second clock signal to the driving signal output end.

At the fourth stage, the node control module is configured to, under the control of the fourth clock signal, apply the fourth clock signal to the third node and, under the control of the potential at the third node, apply the DC signal to the first node, the touch switching module is configured to, under the control of the first touch-control signal, enable the first node to be electrically connected to the second node and apply the potential at the first node to the second node, and the second output module is configured to, under the control of the potential at the third node, apply the DC signal to the driving signal output end.

At the touch stage, the touch switching module is configured to, under the control of the first control signal, enable the first node to be electrically disconnected from the second node, and the second node is in a floating stage such that the first output module is configured to maintain a voltage difference between the second node and the driving signal output end to be the voltage difference within the previous time period and the node control module is configured to, under the control of the potential at the second node, apply the second touch-control signal to the third node, or the third node is in a floating state such that the node control module is configured to maintain a voltage difference between the first end of the node control module and the third node to be the voltage difference within the previous time period, and the second output module is configured to, under the control of the potential at the third node, apply the DC signal to the driving signal output end.

It should be appreciated that, in some embodiments of the present disclosure, the touch stage may be provided between any two adjacent ones of the first stage, the second stage, the third stage and the fourth stage of the display stage, or after the fourth stage of the display stage. The position of the touch stage is not particularly defined herein.

To be specific, in the case that the touch stage is provided between the first stage and the second stage, or between the second stage and the third stage, or between the third stage and the fourth stage, the touch switching module is configured to, under the control of the first touch-control signal, enable the first node to be electrically disconnected from the second node, the second node is in the floating state such that the first output module is configured to maintain the voltage difference between the second node and the driving signal output end to be the voltage difference within the previous time period and the node control module is configured to, under the control of the potential at the second node, apply the second touch-control signal to the third node, and the second output module is configured to, under the control of the potential at the third node, apply the DC signal to the driving signal output end.

In the case that the touch stage is provided after the fourth stage, the touch switching module is configured to, under the control of the first touch-control signal, enable the first node to be electrically disconnected from the second node, the third node is in the floating state such that the node control module is configured to maintain the voltage difference between the first node of the node control module and the third node to be the voltage difference within the previous time period, and the second output module is configured to, under the control of the potential at the third node, apply the DC signal to the driving signal output end.

Figure 6:
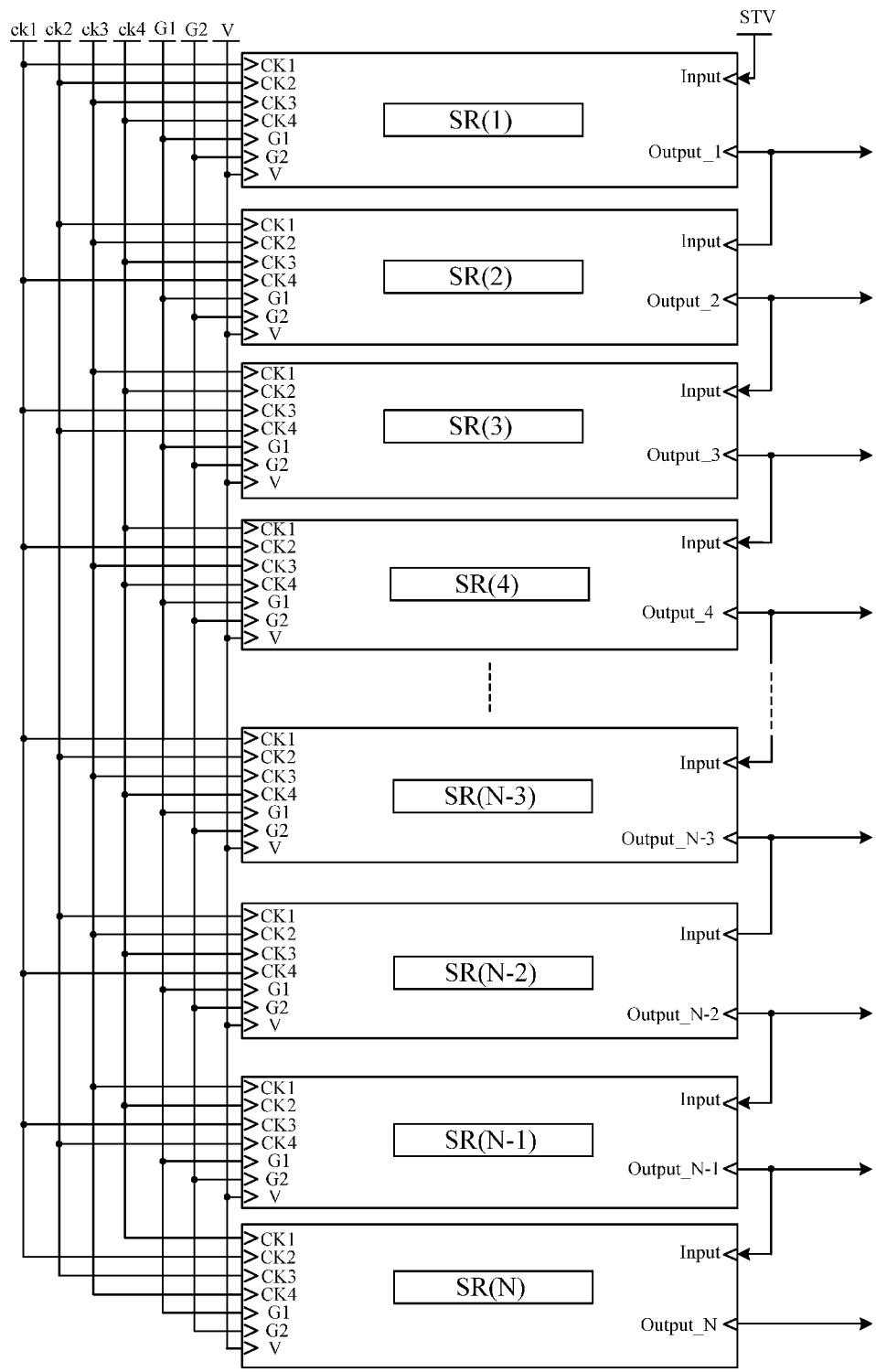
FIG. 6 is a schematic view showing a gate driver circuit having a unidirectional scanning function according to some embodiments of the present disclosure.

Based on an identical inventive concept, the present disclosure further provides in some embodiments a gate driver circuit which, as shown in FIG. 6, includes a plurality of shift registers SR(1), SR(2), SR(n), SR(N-1), and SR(N) (1≤n≤N) connected to each other in a cascaded manner. An input signal Input is applied to a first-level shift register SR(1) through a start signal end STV. Apart from the first-level shift register SR(1), an input signal Input applied to a current-level shift register SR(n) is a scanning signal outputted by a driving signal output end Output_n-1 of a previous-level shift register SR(n-1) connected to the current-level shift register SR(n). A resetting signal Reset applied to the current-level shift register SR(n) is a scanning signal outputted by a driving signal output end Output_n+1 of a next-level shift register SR(n+1) connected to the current-level shift register SR(n).

To be specific, each shift register in the gate driver circuit is identical to that mentioned above in terms of the structure and the function, and thus a description thereof is not repeated herein.

Further, in the embodiments of the present disclosure, the first clock signal, the second clock signal, the third clock signal, the fourth clock signal, the first touch-control signal, the second touch-control signal and the DC signal are all inputted to the shift registers.

Further, as shown in FIG. 6, the first clock signal CK1, the fourth clock signal CK4, the third clock signal CK3, and the second clock signal CK2 are inputted to a $(4n+1)^{th}$-level shift register, a $(4n+2)^{th}$-level shift register, a $(4n+3)^{th}$-level shift register and a $(4n+4)^{th}$-level shift register respectively through an identical clock signal end, i.e., a first clock signal end ck1. The second clock signal CK2, the first clock signal CK1, the fourth clock signal CK4 and the third clock signal CK3 are inputted to the $(4n+1)^{th}$-level shift register, the $(4n+2)^{th}$-level shift register, the $(4n+3)^{th}$-level shift register and the $(4n+4)^{th}$-level shift register respectively through an identical clock signal end, i.e., a second clock signal end ck2. The third clock signal CK3, the second clock signal CK2, the first clock signal CK1 and the fourth clock signal CK4 are inputted to the $(4n+1)^{th}$-level shift register, the $(4n+2)^{th}$-level shift register, the $(4n+3)^{th}$-level shift register and the $(4n+4)^{th}$-level shift register respectively through an identical clock signal end, i.e., a third clock signal end ck3. The fourth clock signal CK4, the third clock signal CK3, the second clock signal CK2 and the first clock signal CK1 are inputted to the $(4n+1)^{th}$-level shift register, the $(4n+2)^{th}$-level shift register, the $(4n+3)^{th}$-level shift register and the $(4n+4)^{th}$-level shift register respectively through an identical clock signal end, i.e., a fourth clock signal end ck4.

An operation procedure during the forward scanning will be described herein after based on an example of the gate driver circuit in FIG. 6 in conjunction with the timing sequence diagram in FIG. 7a.

Figure 7A:
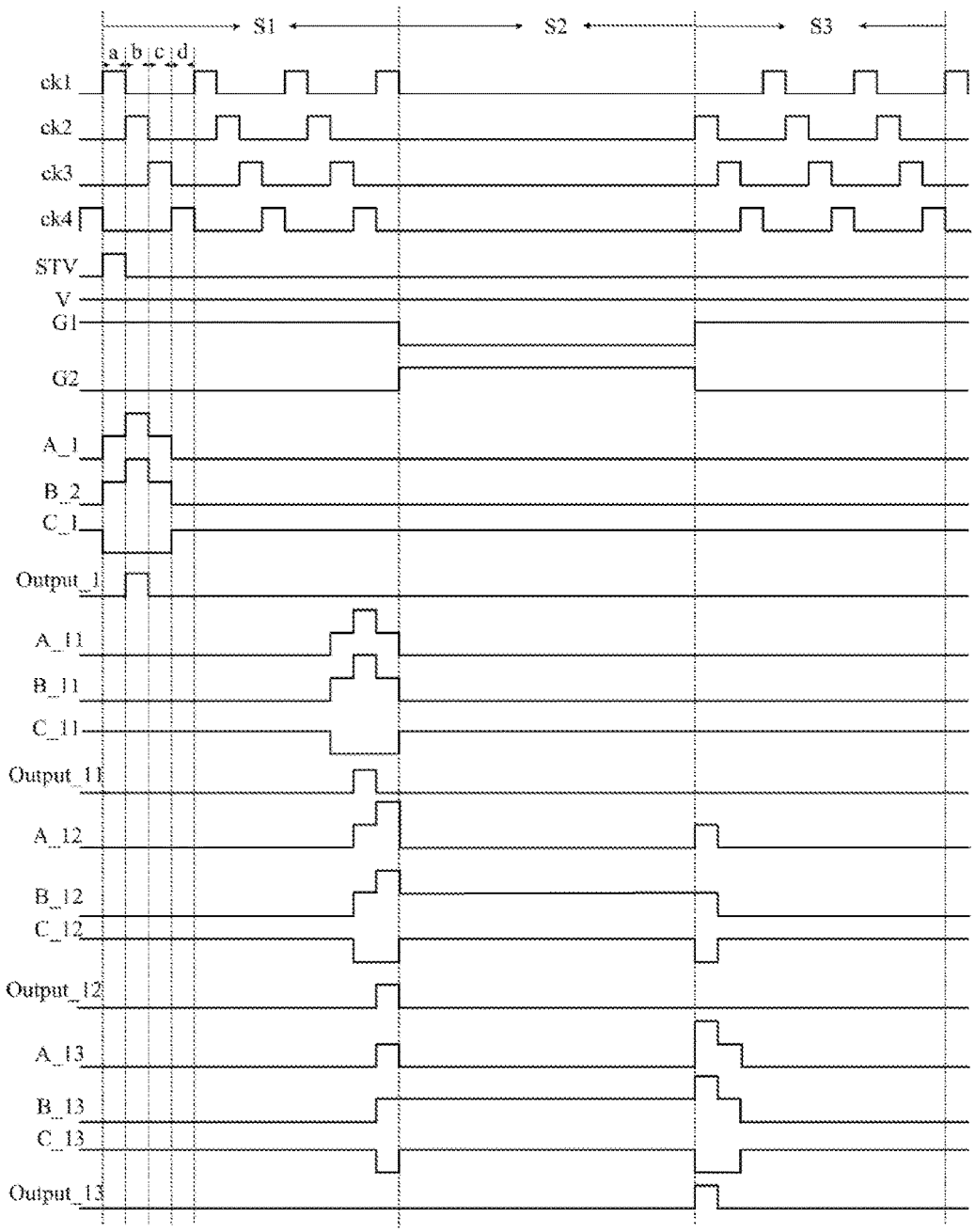
FIG. 7a is a partial timing sequence diagram of the gate driver circuit in FIG. 6 during forward scanning.

In the case that the touch stage S2 is provided after a scanning signal is outputted by a twelfth-level shift register SR(12) and before a scanning signal is outputted by a thirteenth-level shift register SR(13), as shown in FIG. 7a, the following operations may be performed at the touch stage S2.

A first node A_1, a second node B_1 and a driving signal output end Output_1 of the first-level shift register SR(1) are all at a low potential, and a third node C_1 is at a high potential.

The operation procedures of a second-level shift register SR(2) to a tenth-level shift register SR(10) may be identical to that of the first-level shift register SR(1), and the timing sequence of the signals is not shown in FIG. 7a.

The operation procedure of an eleventh-level shift register SR(11) may be similar to that at the touch stage S2 between the stages c and d of the display stage S1 in FIG. 5c. At the touch stage S2, a first node A_11, a second node B_11 and a driving signal output end Output 11 are all at a low potential, and a third node C_11 is at a high potential.

The operation procedure of the twelfth-level shift register SR(12) may be similar to that at the touch stage S2 between the stages b and c of the display stage S1 in FIG. 5d. At the touch stage S2, a first node A_12 and a driving signal output end Output 12 are both at a low potential, and a second node B_12 and a third node C_12 are both at a high potential.

The operation procedure of the thirteenth-level shift register SR(13) may be similar to that at the touch stage S2 between the stages a and b of the display stage S1 in FIG. 5e. At the touch stage S2, a first node A_13 and a driving signal output end Output 13 are both at a low potential, and a second node B_13 and a third node C_13 are both at a high potential.

The shift registers following the thirteenth-level shift register SR(13) may output the scanning signal normally, until a next touch stage or a next image frame comes.

According to the above-mentioned gate driver circuit, during the bidirectional scanning, the input module and the resetting module of each shift register may be replaced with each other in terms of the function. During backward scanning, as compared with forward scanning, the resetting module of each shift register may serve as the input module and the resetting signal may serve as the input signal, while the input module of each shift register may serve as the resetting module and the input signal may serve as the resetting signal. At this time, a function of the circuit, rather than a connection relationship thereof, is changed.

An operation procedure during the backward scanning will be described hereafter based on the gate driver circuit in FIG. 6 in conjunction with the timing sequence diagram in FIG. 7b.

Figure 7B:
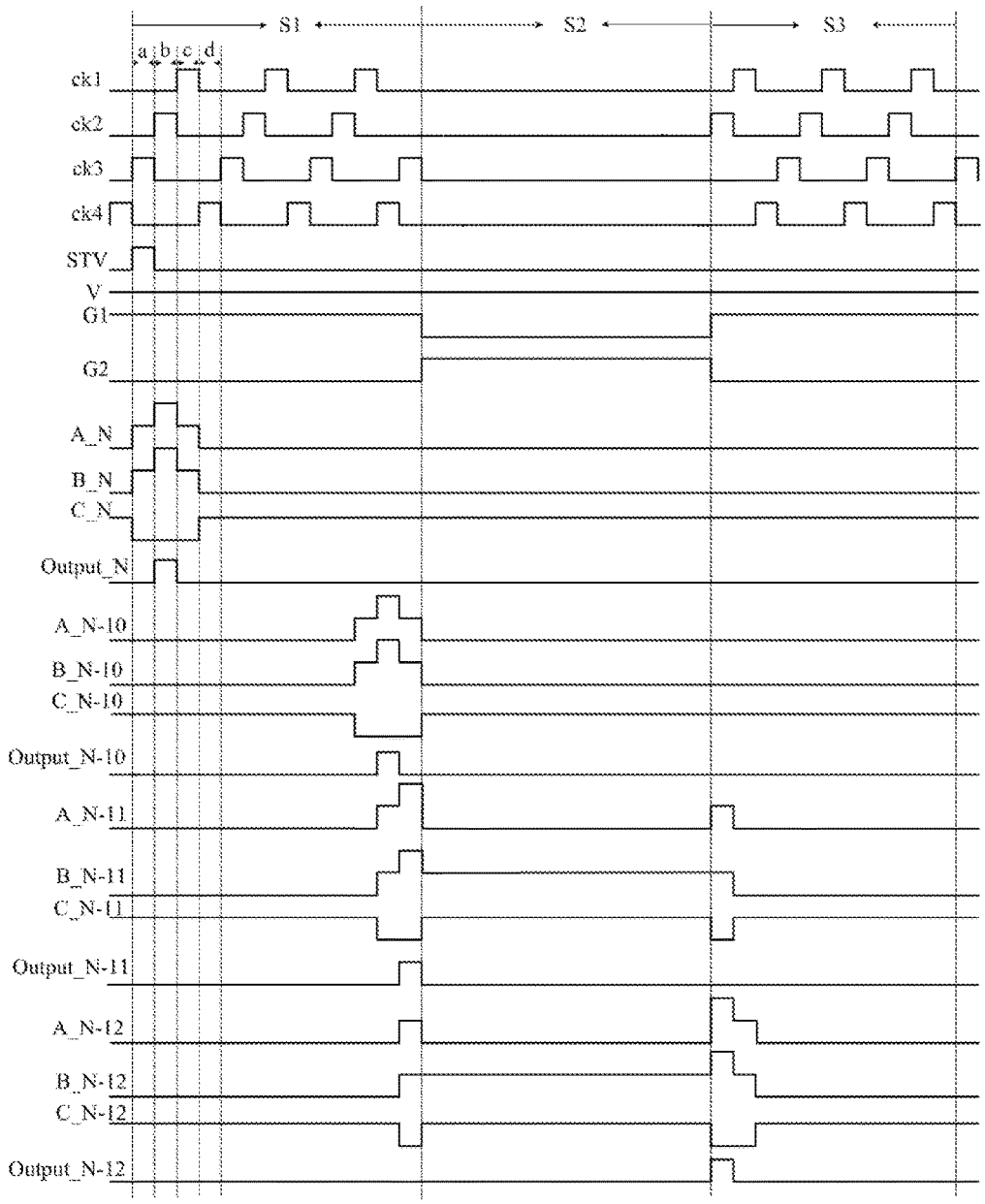
FIG. 7b is a partial timing sequence diagram of the gate driver circuit in FIG. 6 during backward scanning.

In the case that the touch stage S2 is provided after a scanning signal is outputted by an (N−11)$^{th}$-level shift register SR(N−11) and before a scanning signal is outputted by an (N−12)$^{th}$-level shift register SR(N−12), as shown in FIG. 7b, the following operations may be performed at the touch stage S2.

A first node A_N, a second node B_N and a driving signal output end Output_N of an Nth-level shift register SR(N) are all at a low potential, and a third node C_N is at a high potential.

The operation procedures of an (N−1)$^{th}$-level shift register SR(N−1) to an (N−9)$^{th}$-level shift register SR(N−9) may be identical to that of the Nth-level shift register SR(N), and the timing sequence of the signals is not shown in FIG. 7b.

The operation procedure of an (N−10)$^{th}$ shift register SR(N−10) may be similar to that at the touch stage S2 between the stages c and d of the display stage S1 in FIG. 5c. At the second touch stage S2, a first node A_N−10, a second node B_N−10 and a driving signal output end Output_N−10 are all at a low potential, and a third node C_N−10 is at a high potential.

The operation procedure of an (N−11)$^{th}$-level shift register SR(N−11) may be same to that at the touch stage S2 between the stages b and c of the display stage S1 in FIG. 5d. At the touch stage S2, a first node A_N−11 and a driving signal output end Output_N−11 are both at a low potential, and a second node B_N−11 and a third node C_N−11 are both at a high potential.

The operation procedure of an (N−12)$^{th}$-level shift register SR(N−12) may be same to that at the touch stage S2 between the stages a and b of the display stage S1 in FIG. 5e. At the touch stage S2, a first node A_N−12 and a driving signal output end Output_N−12 are both at a low potential, and a second node B_N−12 and a third node C_N−12 are both at a high potential.

The shift registers following the (N−12)$^{th}$-level shift register SR(N−12) may output the scanning signal normally, until a next touch stage or a next image frame comes.

Based on an identical inventive concept, the present disclosure provides in some embodiments a display device including the above-mentioned gate driver circuit. The scanning signal may be applied to gate lines on an array substrate of the display device through the gate driver circuit. The implementation of the display device may refer to that of the gate driver circuit, and thus a description thereof is not repeated herein.

According to the shift register, its driving method, the gate driver circuit and the display device in the embodiments of the present disclosure, the shift register includes the input module, the resetting module, the touch switching module, the node control module, the first output module and the second output module. The input module is configured to adjust the potential at the first node through the input signal and the first clock signal, and the resetting module is configured to adjust the potential at the first node through the resetting signal and the third clock signal. The touch switching module is configured to, under the control of the first touch-control signal, enable the first node to be electrically connected to the second node at the display stage, and enable the first node to be electrically disconnected from the second node at the touch stage. The node control module is configured to adjust the potential at the first node and the potential at the third node through the DC signal, the fourth clock signal, the second touch-control signal, the potential at the second node and the potential at the third node. The first output module is configured to adjust the potential at the driving signal output end through the second clock signal and the potential at the second node. The second output module is configured to adjust the potential at the driving signal output end through the DC signal and the potential at the third node. In the shift register, through the cooperation of the above six modules, it is able to provide the touch stage between any two adjacent time periods of the display stage, it enables the driving signal output end of the shift register to output the DC signal at the touch stage, and enables the gate driver circuit to continue to achieve a display function after the touch stage is ended. As a result, it is able to provide the shift register with a simple structure for the narrow bezel, and to provide the touch period within any display period.

Obviously, a person skilled in the art may make further modifications and improvements without departing from the spirit of the present disclosure, and these modifications and improvements shall also fall within the scope of the present disclosure.

What is claimed is:

1. A shift register, comprising an input module, a resetting module, a touch switching module, a node control module, a first output module and a second output module, wherein
a first end of the input module is configured to receive an input signal, a second end of the input module is configured to receive a first clock signal, and a third end of the input module is connected to a first node;
the input module is configured to enable the first node to be at a first potential in the case that the input signal and the first clock signal are both at the first potential;
a first end of the resetting module is configured to receive a resetting signal, a second end of the resetting module is configured to receive a third clock signal, and a third end of the resetting module is connected to the first node;
the resetting module is configured to enable the first node to be at the first potential in the case that the resetting signal and the third clock signal are both at the first potential;
a first end of the touch switching module is configured to receive a first touch-control signal, a second end of the touch switching module is connected to the first node, and a third end of the touch switching module is connected to a second node;

the touch switching module is configured to, under the control of the first touch-control signal, enable the first node to be electrically connected to the second node at a display stage, and enable the first node to be electrically disconnected from the second node at a touch stage;

a first end of the node control module is configured to receive a direct current (DC) signal, a second end of the node control module is configured to receive a fourth clock signal, a third end of the node control module is configured to receive a second touch-control signal, a fourth end of the node control module is connected to the first node, a fifth end of the node control module is connected to the second node, and a sixth end of the node control module is connected to a third node;

the node control module is configured to apply the DC signal to the first node in the case that the third node is at the first potential, apply the fourth clock signal to the third node in the case that the fourth clock signal is at the first potential, apply the second touch-control signal to the third node in the case that the second node is at the first potential, and maintain a voltage difference between the first end of the node control module and the third node to be a voltage difference within a previous time period in the case that the third node is in a floating state;

a first end of the first output module is connected to the second node, a second end of the first output module is configured to receive a second clock signal, and a third end of the first output module is connected to a driving signal output end of the shift register;

the first output module is configured to apply the second clock signal to the driving signal output end in the case that the second node is at the first potential, and maintain a voltage difference between the second node and the driving signal output end to be the voltage difference within the previous time period in the case that the second node is in the floating state;

a first end of the second output module is connected to the third node, a second end of the second output module is configured to receive the DC signal, and a third end of the second output module is connected to the driving signal output end;

the second output module is configured to apply the DC signal to the driving signal output end in the case that the third node is at the first potential;

in the case that a valid pulse signal of the input signal is at a high potential, the first potential is a high potential, the DC signal is at a low potential, and the second touch-control signal is at a low potential at the display stage and at a high potential at the touch stage; and in the case that the valid pulse signal of the input signal is at a low potential, the first potential is a low potential, the DC signal is at a high potential, and the second touch-control signal is at the high potential at the display stage and at the low potential at the touch stage.

2. The shift register according to claim 1, further comprising a third output module, a first end of the third output module is configured to receive a third touch-control signal, a second end of the third output module is configured to receive the DC signal, and a third end of the third output module is connected to the driving signal output end, wherein the third output module is configured to apply the DC signal to the driving signal output end at the touch stage under the control of the third touch-control signal.

3. The shift register according to claim 1, wherein the input module comprises a first switch transistor, a drain electrode of the first switch transistor is connected to the first node; and a gate electrode of the first switch transistor is configured to receive the input signal and a source electrode of the first switch transistor is configured to receive the first clock signal, or the gate electrode of the first switch transistor is configured to receive the first clock signal and the source electrode of the first switch transistor is configured to receive the input signal.

4. The shift register according to claim 1, wherein the resetting module comprises a second switch transistor, a drain electrode of the second switch transistor is connected to the first node; and a gate electrode of the second switch transistor is configured to receive the resetting signal and a source electrode of the second switch transistor is configured to receive the third clock signal, or the gate electrode of the second switch transistor is configured to receive the third clock signal and the source electrode of the second switch transistor is configured to receive the resetting signal.

5. The shift register according to claim 1, wherein the touch switching module comprises a third switch transistor, a gate electrode of the third switch transistor is configured to receive the first touch-control signal, a source electrode of third switch transistor is connected to the first node, and a drain electrode of third switch transistor is connected to the second node.

6. The shift register according to claim 1, wherein the node control module comprises a fourth switch transistor, a fifth switch transistor, a sixth switch transistor and a first capacitor;

a gate electrode of the fourth switch transistor is connected to the third node, a source electrode of the fourth switch transistor is configured to receive the DC signal, and a drain electrode of the fourth switch transistor is connected to the first node;

a gate electrode and a source electrode of the fifth switch transistor are configured to receive the fourth clock signal, and a drain electrode of the fifth switch transistor is connected to the third node;

a gate electrode of the sixth switch transistor is connected to the second node, a source electrode of the sixth switch transistor is configured to receive the second touch-control signal, and a drain electrode of the sixth switch transistor is connected to the third node; and one end of the first capacitor is connected to the third node, and the other end of the first capacitor is configured to receive the DC signal.

7. The shift register according to claim 1, wherein the first output module comprises a seventh switch transistor and a second capacitor;

a gate electrode of the seventh switch transistor is connected to the second node, a source electrode of the seventh switch transistor is configured to receive the second clock signal, and a drain electrode of the seventh switch transistor is connected to the driving signal output end; and one end of the second capacitor is connected to the second node, and the other end of the second capacitor is connected to the driving signal output end.

8. The shift register according to claim 1, wherein the second output module comprises an eighth switch transistor, a gate electrode of the eighth switch transistor is connected to the third node, a source electrode of the eighth switch transistor is configured to receive the DC signal, and a drain electrode of the eighth switch transistor is connected to the driving signal output end.

9. The shift register according to claim 2, wherein the third output module comprises a ninth switch transistor, a gate electrode of the ninth switch transistor is configured to receive the third touch-control signal, a source electrode of the ninth switch transistor is configured to receive the DC signal, and a drain electrode of the ninth switch transistor is connected to the driving signal output end.

10. The shift register according to claim 1, wherein
in the case that the valid pulse signal of the input signal is at a high potential, all of the switch transistors are N-type transistors; and
in the case that the valid pulse signal of the input signal is at a low potential, all of the switch transistors are P-type transistors.

11. A gate driver circuit comprising a plurality of shift registers each according to claim 1, wherein
the plurality of shift registers are connected in a cascaded manner;
an input signal is applied to a first-level shift register through a start signal end;
apart from the first-level shift register, an input signal is applied to a current-level shift register through a driving signal output end of a previous-level shift register connected to the current-level shift register; and
apart from a last-level shift register, a resetting signal is applied to the current-level shift register through a driving signal output end of a next-level shift register connected to the current-level shift register.

12. A display device comprising the gate driver circuit according to claim 11.

13. A method for driving the shift register according to claim 1, comprising a display stage and a touch stage, wherein
the display stage comprises a first stage, a second stage, a third stage and a fourth stage;
at the first stage, the input module applies the first clock signal to the first node under the control of the input signal, the touch switching module enables the first node to be electrically connected to the second node and applies a potential at the first node to the second node under the control of the first touch-control signal, the node control module applies the second touch-control signal to the third node under the control of the potential at the second node, and the first output module applies the second clock signal to the driving signal output end under the control of the potential at the second node;
at the second stage, the second node is in a floating state, the first output module maintains a voltage difference between the second node and the driving signal output end to be a voltage difference within a previous time period, and applies the second clock signal to the driving signal output end under the control of the potential at the second node, and the node control module applies the second touch-control signal to the third node under the control of the potential at the second node;
at the third stage, the resetting module applies the third clock signal to the first node under the control of the resetting signal, the touch switching module enables the first node to be electrically connected to the second node and applies the potential at the first node to the second node under the control of the first touch-control signal, the node control module applies the second touch-control signal to the third node under the control of the potential at the second node, and the first output module applies the second clock signal to the driving signal output end under the control of the potential at the second node;
at the fourth stage, the node control module applies the fourth clock signal to the third node under the control of the fourth clock signal, and applies the DC signal to the first node under the control of the potential at the third node, the touch switching module enables the first node to be electrically connected to the second node and applies the potential at the first node to the second node under the control of the first touch-control signal, and the second output module applies the DC signal to the driving signal output end under the control of the potential at the third node; and
at the touch stage,
the touch switching module enables the first node to be electrically disconnected from the second node under the control of the first touch-control signal; and
the second node is in the floating stage, the first output module maintains a voltage difference between the second node and the driving signal output end to be the voltage difference within the previous time period, and the node control module applies the second touch-control signal to the third node under the control of the second node; or the third node is in a floating state, the node control module maintains a voltage difference between the first end of the node control module and the third node to be the voltage difference within the previous time period, and the second output module applies the DC signal to the driving signal output end under the control of the potential at the third node.

14. The method according to claim 13, wherein the touch stage is capable of being provided between any two adjacent ones of the first stage, the second stage, the third stage and the fourth stage of the display stage, or provided after the fourth stage of the display stage.

15. The method according to claim 14, wherein
in the case that the touch stage is provided between the first stage and the second stage, or between the second stage and the third stage, or between the third stage and the fourth stage, the touch switching module enables the first node to be electrically disconnected from the second node under the control of the first touch-control signal, the second node is in the floating state, the first output module maintains the voltage difference between the second node and the driving signal output end to be the voltage difference within the previous time period, and the node control module applies the second touch-control signal to the third node under the control of the second node, and the second output module applies the DC signal to the driving signal output end under the control of the potential at the third node; and
in the case that the touch stage is provided after the fourth stage, the touch switching module enables the first node to be electrically disconnected from the second node under the control of the first touch-control signal, the third node is in the floating state, the node control module maintains the voltage difference between the first end of the node control module and the third node to be the voltage difference within the previous time period, and the second output module applies the DC signal to the driving signal output end under the control of the potential at the third node.

16. The gate driver circuit according to claim 11, wherein the shift register further comprises a third output module,
a first end of the third output module is configured to receive a third touch-control signal, a second end of the third output module is configured to receive the DC signal, and a third end of the third output module is connected to the driving signal output end,
wherein the third output module is configured to apply the DC signal to the driving signal output end at the touch stage under the control of the third touch-control signal.

17. The gate driver circuit according to claim 11, wherein the input module comprises a first switch transistor, a drain electrode of the first switch transistor is connected to the first node; and
a gate electrode of the first switch transistor is configured to receive the input signal and a source electrode of the first switch transistor is configured to receive the first clock signal, or the gate electrode of the first switch transistor is configured to receive the first clock signal and the source electrode of the first switch transistor is configured to receive the input signal.

18. The gate driver circuit according to claim 11, wherein the resetting module comprises a second switch transistor,
a drain electrode of the second switch transistor is connected to the first node; and
a gate electrode of the second switch transistor is configured to receive the resetting signal and a source electrode of the second switch transistor is configured to receive the third clock signal, or the gate electrode of the second switch transistor is configured to receive the third clock signal and the source electrode of the second switch transistor is configured to receive the resetting signal.

19. The gate driver circuit according to claim 11, wherein the touch switching module comprises a third switch transistor, a gate electrode of the third switch transistor is configured to receive the first touch-control signal, a source electrode of third switch transistor is connected to the first node, and a drain electrode of third switch transistor is connected to the second node.

20. The gate driver circuit according to claim 11, wherein the node control module comprises a fourth switch transistor, a fifth switch transistor, a sixth switch transistor and a first capacitor;
a gate electrode of the fourth switch transistor is connected to the third node, a source electrode of the fourth switch transistor is configured to receive the DC signal, and a drain electrode of the fourth switch transistor is connected to the first node;
a gate electrode and a source electrode of the fifth switch transistor are configured to receive the fourth clock signal, and a drain electrode of the fifth switch transistor is connected to the third node;
a gate electrode of the sixth switch transistor is connected to the second node, a source electrode of the sixth switch transistor is configured to receive the second touch-control signal, and a drain electrode of the sixth switch transistor is connected to the third node; and
one end of the first capacitor is connected to the third node, and the other end of the first capacitor is configured to receive the DC signal.

* * * * *